United States Patent
Herz et al.

(10) Patent No.: US 9,410,641 B2
(45) Date of Patent: Aug. 9, 2016

(54) METHOD FOR MANUFACTURING A BENDING TRANSDUCER, A MICRO PUMP AND A MICRO VALVE, MICRO PUMP AND MICRO VALVE

(75) Inventors: Markus Herz, Munich (DE); Martin Richter, Munich (DE); Martin Wackerle, Munich (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 423 days.

(21) Appl. No.: 13/604,294

(22) Filed: Sep. 5, 2012

(65) Prior Publication Data

US 2013/0055889 A1   Mar. 7, 2013

Related U.S. Application Data

(63) Continuation of application No. PCT/EP2010/052858, filed on Mar. 5, 2010.

(51) Int. Cl.
| | |
|---|---|
| *F04B 45/04* | (2006.01) |
| *F16K 99/00* | (2006.01) |
| *F04B 43/04* | (2006.01) |
| *H01L 41/09* | (2006.01) |

(52) U.S. Cl.
CPC ............ *F16K 99/0001* (2013.01); *F04B 43/043* (2013.01); *F16K 99/0015* (2013.01); *F16K 99/0048* (2013.01); *H01L 41/0973* (2013.01); *F16K 2099/008* (2013.01); *F16K 2099/0094* (2013.01); *Y10T 29/49236* (2015.01)

(58) Field of Classification Search
CPC .... F04B 43/046; F04B 45/047; F04B 19/006; F04B 43/043; F04B 45/04; F04B 43/095; F04B 17/003; F04B 17/03; F04B 19/24; F04B 43/02; F04B 43/04; F04B 53/1047; B41J 2002/041; B41J 2/1635; B82Y 30/00; B82Y 10/00; H01L 27/20; H01L 41/0973; F16K 99/0001; F16K 99/0015; F16K 2099/008; F16K 2099/0094; F16K 99/0048; Y10T 29/49236

USPC ....................... 156/221, 160; 92/96

See application file for complete search history.

(56) References Cited

U.S. PATENT DOCUMENTS

| | | | |
|---|---|---|---|
| 5,305,507 A | 4/1994 | Dvorsky et al. | |
| 5,759,014 A | 6/1998 | Van Lintel | |
| 6,261,066 B1 | 7/2001 | Linnemann et al. | |
| 2004/0036047 A1* | 2/2004 | Richter | F15C 5/00 251/129.06 |
| 2004/0154730 A1* | 8/2004 | Clingman et al. | 156/160 |
| 2005/0123420 A1 | 6/2005 | Richter et al. | |
| 2006/0027772 A1 | 2/2006 | Richter et al. | |
| 2009/0158923 A1* | 6/2009 | Lass | 92/96 |

FOREIGN PATENT DOCUMENTS

| | | |
|---|---|---|
| CN | 1369638 | 9/2002 |
| EP | 0424087 | 4/1991 |

* cited by examiner

*Primary Examiner* — Jacob T Minskey
*Assistant Examiner* — Vishal I Patel
(74) *Attorney, Agent, or Firm* — Perkins Coie LLP; Michael A. Glenn

(57) ABSTRACT

A method of manufacturing a bending transducer having a drive element and a membrane includes providing the membrane and the drive element and applying a production signal to the drive element during a bonding of the drive element to the membrane such that the drive element is pre-stressed after the bonding, wherein the production signal is of a same kind as an operation signal to operate the bending transducer.

13 Claims, 15 Drawing Sheets

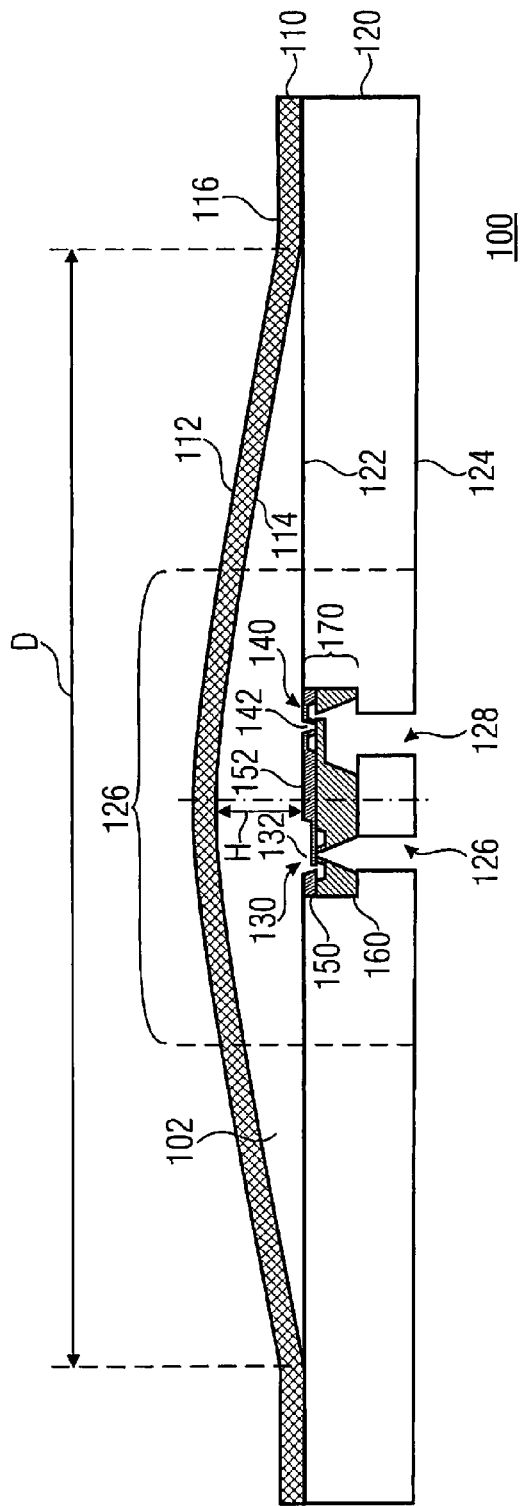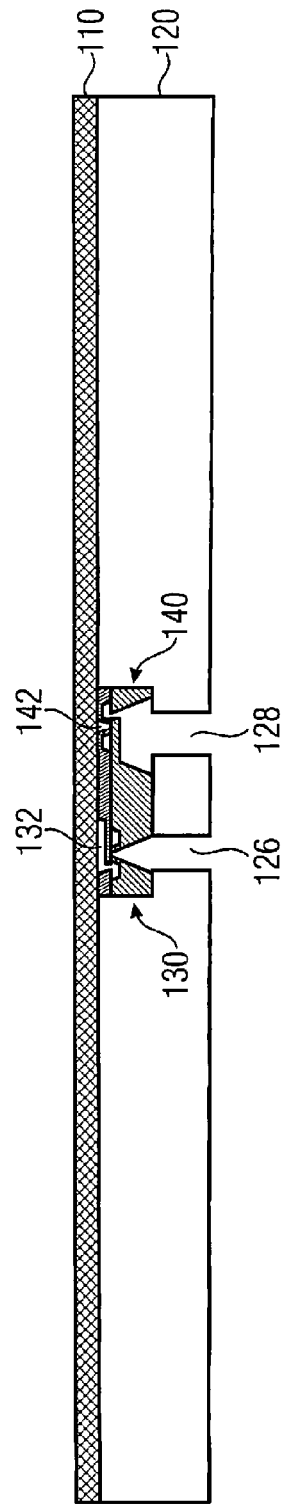
FIG 1B
FIG 1C

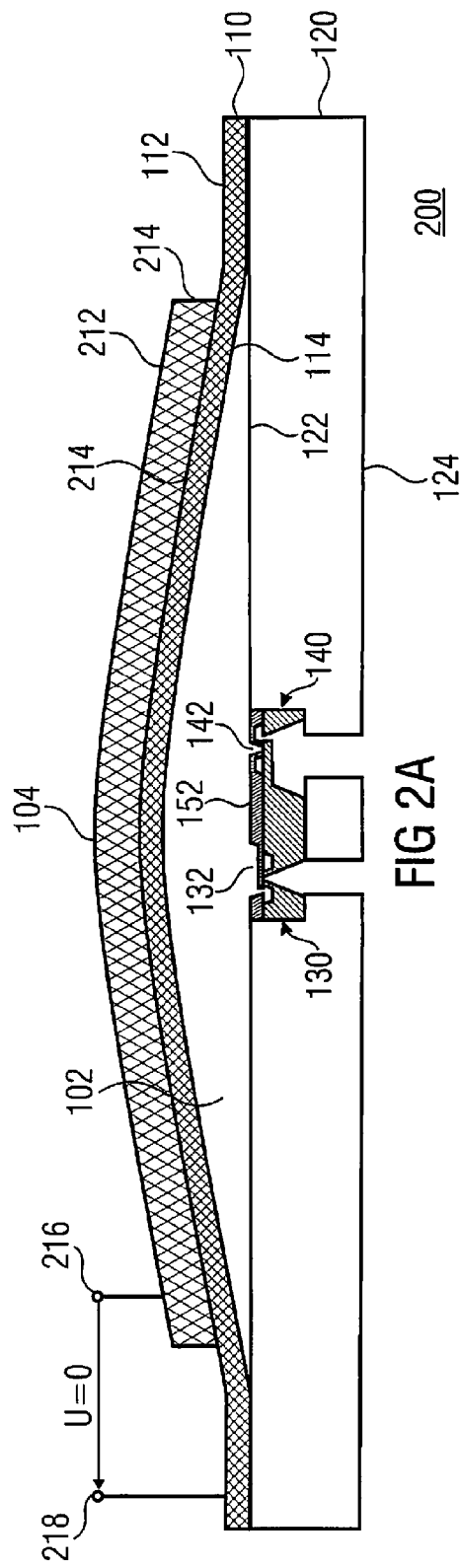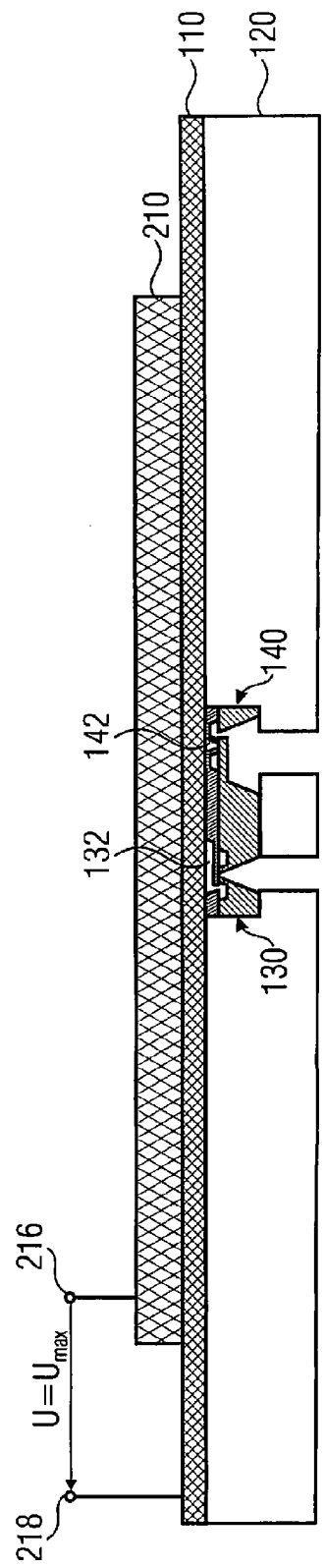

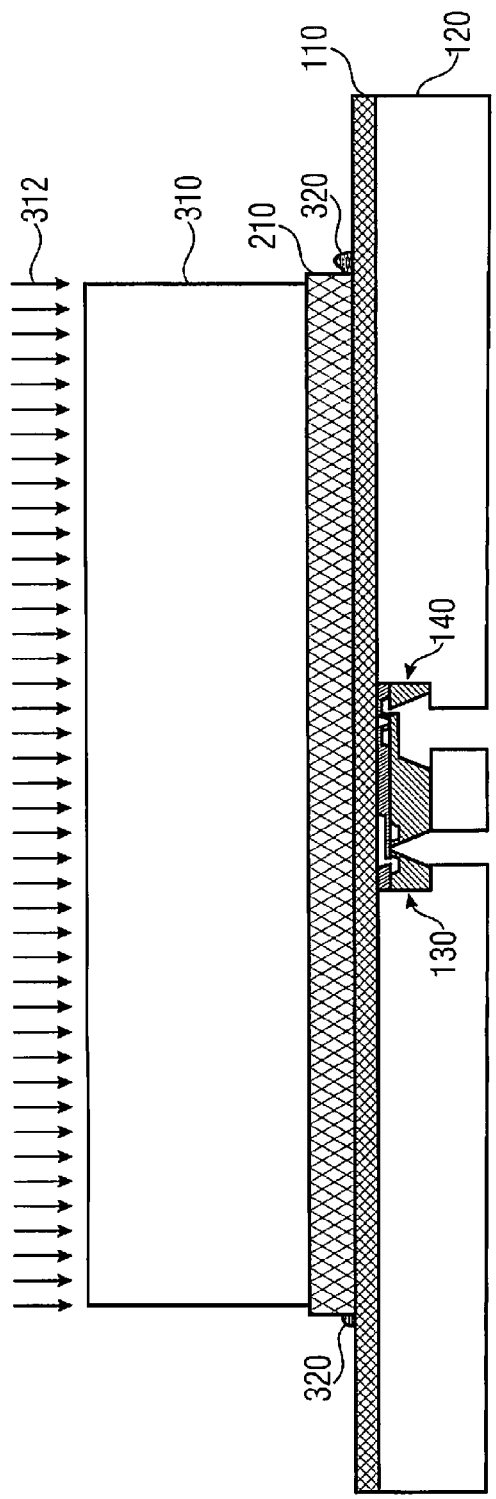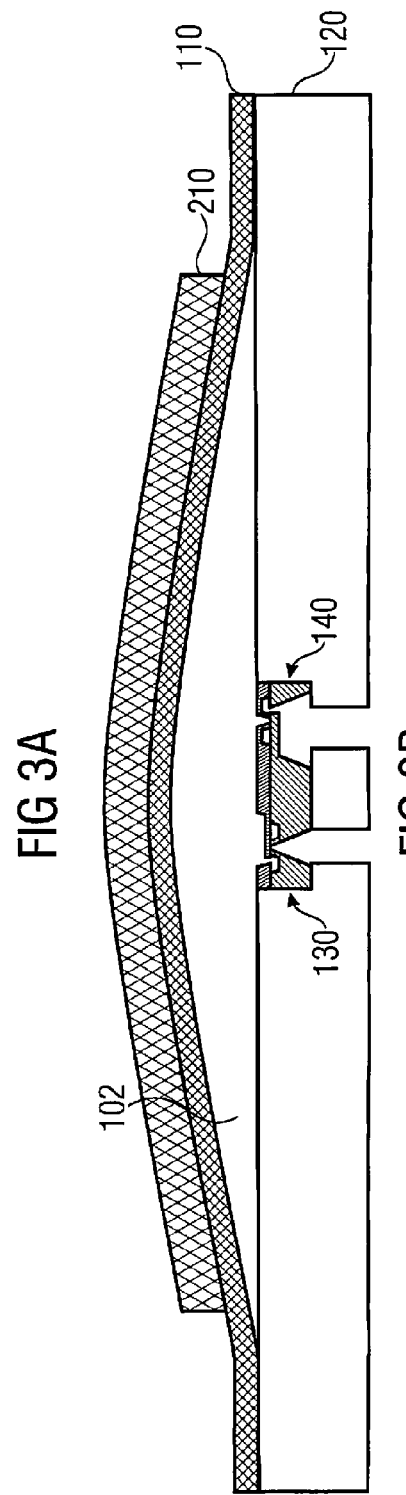

valve open (U>0)

side view (90° turn)

METHOD FOR MANUFACTURING A BENDING TRANSDUCER, A MICRO PUMP AND A MICRO VALVE, MICRO PUMP AND MICRO VALVE

CROSS-REFERENCE TO RELATED APPLICATIONS

This application is a continuation of copending International Application No. PCT/EP2010/052858, filed Mar. 5, 2010, which is incorporated herein by reference in its entirety.

BACKGROUND OF THE INVENTION

The present invention relates to a method for manufacturing a bending transducer, a micro pump and a micro valve, and to a micro pump and a micro valve comprising the bending transducer manufactured according to the method.

According to conventional technology a large number of different micro membrane pumps exist, the drive concepts used being electromagnetic, thermal and piezoelectric driving principles. However, almost all of the micro membrane pumps available on the market are driven by piezoelectric driving principles.

The compression ratio of micro pumps is an important parameter that defines the bubble tolerance and the counter pressure capability of the micro pumps when gasses are the media to be pumped. As also for fluid pumps gas bubbles may at any time enter into the pump chamber, the counter pressure capability for liquid pumps is also defined—in practice—by the compression ratio (besides large actuation diaphragm force and low valve leakages). The compression ratio is defined as the ratio between the volume displaced by the pump membrane in one blow or cycle, the so-called stroke volume, and the dead volume, i.e. the minimum volume remaining when the pump membrane has been moved to pump the media contained in the pump chamber out of the pump chamber. The dead volume can also be referred to as the difference in volume between the maximum pump chamber volume and the stroke volume. The compression ratio of known micro pumps is relatively small and within a range of 0.1 to 1.

Patent application publication EP 0 424 087 A1 describes, for example, a micro pump with a piezo-electric means being deformable by voltage signals in first and second directions, i.e. upward and downward, so as respectively to draw liquid into and expel liquid from the liquid reservoir of the micro pump. The micro pumps described in EP 0 424 087 A1, however, are disadvantageous in that they either comprise considerably large dead volumes or only allow small strokes in the upward direction and thus only small stroke volumes.

Furthermore, the compression ratio of piezo-electrically driven micro membrane pumps is typically defined by the following boundary conditions. When applying a positive voltage to a piezo-membrane transducer, the membrane transducer can only be deflected in downward direction. The deflection upwards is only possible by applying a negative voltage, wherein only about 20% of the downward stroke is achievable, as otherwise the piezo ceramics would be depolarized. When restricting the movement of the membrane to the downward movement it is difficult to reduce the dead volume and to increase the compression ratio. Therefore, for conventional micro pumps, see for example the micro membrane pump of US 2005/0123420 A1 and the peristaltic micro pump of U.S. Pat. No. 6,261,066 B1, the piezo-electric means is only moved in one direction and/or the pump chamber is formed such that its contour is adapted to the bend line of the membrane to reduce the dead volume and to thus maximize the compression ratio. This adaptation to the bend line of the pumping membrane is complex and costly with regard to production engineering, and furthermore a complete adaptation to the bend line is typically not possible because the pumping membrane deflects itself not completely symmetrically, for example, because of distortions of the pumping membrane due to the gluing process, so that gaps remain within the pump chamber that reduce the compression ratio. Furthermore, the stroke volume of a standard actuator is limited by the boundary conditions, if the edges of the diaphragm are clamped. Finally, with silicon this alignment can only partly be achieved by etching several steps into the wafer, which causes a high effort.

U.S. Pat. No. 5,759,014 describes a micro pump with a silicon pumping membrane arranged on a glass base plate and an inlet valve and an outlet valve arranged opposite to each other on opposite sides of the pumping membrane. The pumping membrane has an upwardly bulging shape in the rest position. An piezoelectric element is secured to the top of the membrane. In case the piezoelectric element is activated, the membrane displaces downwardly. The bulged shape of the membrane can be obtained by placing under vacuum the chamber located above the hermetically closed membrane or by applying to its upper surface an oxide layer including a pre-stress suitable deformation. Micro pumps according to U.S. Pat. No. 5,759,014 are disadvantageous in that the dead volume caused by the connection spaces between the pumping chamber and the inlet and outlet valve is still considerably high, the achievable bulging heights of the membrane are limited (thus, only facilitating limited compression ratios), and involve a considerable amount of circular regions of silicon oxide on the lower surface of the membrane to prevent sticking or suction of the membrane. In addition, the lateral arrangement of the valves increases the flow resistance in the pump chamber significantly, with that the stroke volume can only transported at very low pump frequencies, limiting the maximal pump rate. Another disadvantage of the buckling by oxide layer or vacuum is the fact, that if a piezo is actuated by a positive voltage, the diaphragm cannot be moved to a completely flat position. Thus, a dead volume at the border of the diaphragm remains.

US2009/0158923 A1 describes a pre-stressing of the pump diaphragm realized by laser welding of two metal layers. This application states that (obviously due to the thermal impact of the welding process) a pre-stressing of the diaphragm and the pump chamber can be realized. However, again, a large dead volume (which is even larger than the dead volume due to the oxide layer in U.S. Pat. No. 5,759,014) remains at the border of the diaphragm after actuation of the piezo.

In fact, the joining of the actuation membrane with the pump chamber by laser welding as depicted in FIG. 8 causes an unavoidable buckling of the membrane, which is not optimized with respect to a minimized dead volume. FIG. 8 shows two schematic drawings of a micro pump with a pump body 810 and a membrane 820 bonded to the pump body by laser welding at the border of the pump membrane. The top part of FIG. 8 shows the pump membrane 820 in a pre-stressed non-actuated state, and the lower part of FIG. 8 shows the same membrane 820 bent down by a piezo element 830 arranged on top of the pump membrane. As can be seen from the lower part of FIG. 8, the membrane 820 is not completely flat, but shows bulges or deflections 840 at the border of the pump membrane that cause an increased dead volume due to the volumes defined by these bulges 840 at the border of the membrane.

US 2004/0036047 A1 and US 2006/0027772 A1 describe normally closed valves. Formed by a stack of two silicon chips, wherein the lower silicon chip comprises the inlet and outlet of the valve, and wherein the upper chip mounted on the lower chip, comprises a valve chamber recess, a valve lip and a tappet on a side facing towards the lower chip, and a recess on the opposite side of the upper chip facing away from the lower chip for defining a membrane, wherein on the membrane above the tappet a piezo drive is arranged to move a valve shutter formed in the lower chip down to open the valve. In a closed state, i.e. when the piezo ceramic is not actuated, the valve lip fluidly decouples the valve inlet from the valve chamber. In case the piezo ceramic is activated, the piezo ceramic moves down the valve shutter that is connected to the membrane via the tappet. In this case the valve lip does not abut on the tappet anymore and the valve is open. It has been recognized that a membrane sometimes tends to be deflected in the downward direction after the production of the valve. In case these deflections in a downward direction are to large, the valve might not fulfill the denseness requirements for normally closed valves or might open at slight pressures in reverse direction to the membrane. Such undesired flows in the non-actuated state of the valve need are disadvantageous and can be even critical in the fields of medical technology or fuel cells.

It is the object of the present invention to provide a method of manufacturing a bending transducer allowing to eliminate one or all of the above mentioned disadvantages of conventional technology. It is a further object of the present invention to provide a micro pump that is capable of providing high compression ratios and that can be easily production engineered. An even further object of the present invention is to provide a micro valve with reliable denseness characteristics.

SUMMARY

According to an embodiment, a method for manufacturing a micro pump, the micro pump including a bending transducer with a membrane and a drive element, wherein the membrane forms a pump membrane and is adapted to be moved between a first bulged position and a second less bulged position by the drive element; and a pump body connected to the pump membrane so as to define the pump chamber between the pump body and the pump membrane; may have the step of: manufacturing the bending transducer by a method having the steps of providing the membrane and the drive element; and applying a production signal to the drive element during the bonding of the drive element to the membrane such that the drive element is pre-stressed after the bonding, wherein the production signal is of a same kind as an operation signal to operate the bending transducer, such that the pump membrane assumes a pre-bulged shape in the first bulged position when the drive element is not actuated.

According to another embodiment, a micro pump may have: a bending transducer including a membrane and a drive element, wherein the membrane forms a pump membrane of the micro pump and is adapted to be moved between a first bulged position and a second less bulged position by the drive element; and a pump body connected to the pump membrane so as to define the pump chamber between the pump body and the pump membrane; wherein the pump membrane assumes a pre-bulged shape in the first bulged position when the drive element is not actuated, and wherein the bending transducer has been manufactured by a method which may have the steps of: providing the membrane and the drive element; and applying a production signal to the drive element during the bonding of the drive element to the membrane such that the drive element is pre-stressed after the bonding, wherein the production signal is of a same kind as an operation signal to operate the bending transducer.

Embodiments of the present invention provide a method for manufacturing a bending transducer comprising a drive means and a membrane, the method comprising: providing the membrane and the drive means; and applying a production signal to the drive means during a bonding of the drive means to the membrane such that the drive means is pre-stressed after the bonding, wherein the production signal is of a same kind as an operation signal to operate the bending transducer.

Embodiments of the bending transducer comprise a membrane and a drive means bonded to the membrane, wherein the drive means is bonded with a main surface of the drive means to the bendable or deflectable membrane so as to convert an operation or actuation signal applied to the drive means into a movement of the bending transducer vertical to the main surface via which the drive means is bonded to the membrane. In other words, the operation signal effects a change in dimension (contraction or extraction) of the drive means parallel to the main surface via which the drive means is bonded to the membrane (also referred to as lateral dimension or direction) which is converted into a movement vertical in relation to the main surface via which the drive means is bonded to the membrane (also referred to as vertical dimension or direction). The degree of the conversion is defined by the d31 coefficient of the drive means. Due to the manufacturing method these bending transducers are pre-stressed or pre-bulged. Such pre-stressed bending transducers can be used in micro pumps and micro valves to overcome the aforementioned problems The drive means can be, for example, piezo drive means or any other drive means that is adapted to change its volume or at least one dimension when a certain kind of actuation signal or input is applied to the drive means. In case of piezo drive means the production signal and the operation signal are voltages applied to the piezo drive means. In case positive voltages are applied, the piezo drive means contracts, and thus, moves the membrane in direction to the membrane relative to a bonding surface between the drive means and the membrane Alternative embodiments of the drive means are, for example, magneto restrictive drive means or drive means comprising magnetorestrictive materials that change their volume in case a magnetic field is applied to the magnetorestrictive drive means. In this case the production signal and the operation signal (the signal applied to the drive means during normal operation later) are electromagnetic fields.

As becomes apparent from the aforementioned examples, the production signal and the operation signal are of the same kind of a signal (voltages for piezo drive means, magnetic fields for magnetorestrictive drive means).

The magnitude of the production signal (voltage level of the production signal and the operation signal for piezo drive means, magnetic field strength for the magnetorestrictive drive means) can be the same or can be different for the production signal and the operation signal.

The polarity or direction of the production signal (the polarity of the voltage for piezo drive means, the direction of the magnetic field for magnetorestrictive drive means) can be the same or can be different, e.g. inverse, for the production signal and the operation signal.

In case the polarity or direction of the production signal and of the operation signal are the same, the kind of pre-bulging of the bending transducer (of the membrane and/or the drive means) achieved by the inventive method is exactly the same as the corresponding stroke of the membrane or bending transducer when the drive mean is actuated.

In certain embodiments the production signal has the same polarity as the production signal and the magnitude of the production signal the same magnitude as the production signal or a smaller or a higher magnitude, depending on the application.

Further embodiments of the invention provide a method for producing a micro pump, the micro pump comprising a bending transducer with a membrane and a drive means, wherein the membrane forms a pump membrane and is adapted to be moved between a first bulged position and a second less bulged position by a drive means; and a pump body connected to the pump membrane so as to define the pump chamber between the pump body and the pump membrane; the method comprising manufacturing the bending transducer by the inventive method such that the pump membrane assumes a pre-bulged shape in the first bulged position when the drive means is not actuated.

Even further embodiments of the invention provide a method for producing a micro valve, the micro valve comprising a bending transducer with a membrane and a drive means, wherein the membrane forms a valve membrane and is adapted to be moved between a first position and a second position by the drive means to open or close the micro valve; the method comprising: manufacturing the bending transducer by the inventive method.

Embodiments also provide a micro pump, the micro pump comprising: a bending transducer comprising a membrane and a drive means, wherein the membrane forms a pump membrane of the micro pump and is adapted to be moved between a first bulged position and a second less bulged position by the drive means; and a pump body connected to the pump membrane so as to define the pump chamber between the pump body and the pump membrane; wherein the pump membrane assumes a pre-bulged shape in the first bulged position when the drive means is not actuated, and wherein the bending transducer has been manufactured by the inventive method.

Embodiments in addition provide a micro valve, the micro valve comprising: a bending transducer comprising a membrane and a drive means, wherein the membrane forms a valve membrane and is adapted to be moved between a first position and a second position by the drive means to open or close the micro valve; wherein the bending transducer has been manufactured by the inventive method.

Embodiments of the present invention are based on the finding that the bulges 840 of the micro pump shown in FIG. 8 and the corresponding dead volumes are caused by the fact that the bending shape of the prestressed diaphragm or membrane is not exactly the same as the corresponding stroke of the piezo actuator. In other words, the deflection of the pre-stressed membrane caused by the prestressing during production (e.g. oxide layer or laser welding) is different to the deflection of the membrane caused by the piezo actor during operation of the micro pump.

Embodiments of the present invention allow to maximize the compression ratio by providing a pre-bulging method for the pump membrane, which is adapted to the piezo membrane movement or, in general, to the actor-membrane movement. Thus, the bulges 840 and the corresponding dead volumes can be avoided or at least reduced. To achieve a pre-bulging of the pump membrane that is adapted to the movement of the pump membrane caused by the drive means bonded to the pump membrane, embodiments of the method comprise the step of bonding the drive means to the pump membrane such that the pump membrane assumes a pre-bulged shape when the drive means is not actuated. Thus, when the drive means is actuated, and correspondingly the membrane to assume the second less-bulged position, the tension or stress of the pump membrane caused by the drive means in the non-actuated state is reduced. In embodiments of the method for producing the pre-bulged pump membrane, the drive means can, for example, be bonded to the pump membrane when both have a planar shape. Due to the different temperature coefficients and/or the application of a production signal to contract the drive means laterally when bonding the drive means to the pump membrane, the pump membrane together with the drive means assumes an upwardly pre-bulged shape in the first bulged position when the drive means is not actuated. The actuation of the drive means causes the drive means to contract again (at the same time reducing the tension of the pump membrane), the downward deflection of the membrane representing the reverse deflection to the pre-bulging, and in case the drive signal for driving or actuating the drive means is strong enough to cause the drive means to assume again the planar or an least essentially planar shape without or at least negligible bulges at the border.

In other words, the deformation of the membrane caused by the actuation of the drive means represents the inverse effect and deformation caused by the pre-bulging and, thus, at least reduces the bulges or deflections 840 at the borders of the pump membrane.

In even other words, embodiments of the present invention provide micro pumps, wherein the bending shape of the pre-bulged pump membrane is adapted to the deformation caused by the actuation of the drive means, such that the pump membrane facing the pump body has a planar base shape when the pump membrane is in the second less bulged or planar position and no counter-pressure is applied. The term "planar base shape" indicates that in case the pump chamber floor is planar or planar with cavities, the pump membrane has a planar shape, and in case the pump chamber floor or the pump membrane comprise protrusions as anti-sticking means distributed over the pump chamber floor, the pump membrane may be slightly bulged at the border of the pump chamber floor, where the outmost anti-sticking means are arranged and assumes there from towards the central part of the pump chamber a planar shape carried by the anti-sticking protrusions due to its stiffness.

According to an embodiment of a method of producing the micro pump, the drive means, e.g. a piezo drive means, is connected to the pump membrane in a contracted state, i.e. a predetermined production signal or voltage is applied to the drive means to cause the contraction of the drive means, and the signal voltage is released afterwards. Due to the release of the signal or voltage, the drive means extracts and thus bends the membrane together with the drive means upwards and away from the pump chamber.

According to a further embodiment of a method of producing the micro pump, the pump membrane and the drive means, e.g. a piezo drive means are additionally heated to a predetermined production temperature, are bonded to each other at this production temperature, and are cooled down, for example, to a normal ambient temperature afterwards. Due to the different thermal expansion coefficients of the drive means and the pump membrane the bending transducer is pre-stressed in an additional manner.

On one hand, this effect can be used to produce bending transducers with increased pre-stress characteristics that can, for example, be used to provide pump or valve membranes with even further increased pre-bulging heights.

On the other hand, in case the different temperature expansion coefficients of the drive means and the pump membrane would normally lead to a pre-bulging in the downward direction (direction from the drive means towards the pump membrane) a production signal can be applied such that a pre-bulging of the pump membrane in a first direction effected by releasing the production signal more than compensates a pre-bulging of the pump membrane in a second direction opposite to the first directed effected by cooling upon the drive means and the pump membrane, for example to normal or ambient temperature.

This second aspect is in particular advantageous for semiconductor membranes which have typically lower thermal expansion coefficients than piezo ceramics or other piezo drive means and, thus, lead to the unwanted pre-bulging in a downward direction. By applying a production signal to the piezo drive means that causes the piezo drive means to contract, a downward pre-bulging can be more than compensated and, thus, a pre-bulging in an upward direction (from the pump membrane towards the piezo drive means) can be achieved.

Thus, normally closed valves as described in US 2004/0036047 A1 and US 2006/0027772 A1 can be more reliably closed or sealed in the non-actuated state by pre-stressing the bending transducer formed by the piezo drive means and the silicon membrane.

With regard to micro pumps, the compression ratio c of micro pumps is defined by the ratio of the stroke volume $\Delta V$ and the dead volume $V_0$, i.e. $c=\Delta V/V_0$. Therefore, two measures can primarily be taken into account to increase the compression ratio. First, to increase the stroke volume $\Delta V$, and second to reduce the dead volume $V_0$. Embodiments of the invention allow to address both measures and, thus, to increase the compression ratio.

The arrangement of the input and output check valve opposite and below the membrane and within the pump body allow to achieve high stroke volumes and at the same time reduce the dead volumes. The pre-bulging of the pump membrane, furthermore, only involves using or actuating the drive means, and in particular the piezo drive means, in one direction (e.g. only in downward direction), and, thus reduces the complexity of the drive means and in case of piezo drive means reduces the risk of depolarization.

Depending on the shape of the upper surface of the pump body forming the pump chamber floor, and the shape of the pumping membrane in the second less bulged position, the dead volume of the micro pump can be reduced. Therefore, embodiments of the micro pump comprise, for example, no spacing means or spacing structures arranged between the pump membrane and the pump chamber floor, and further comprise an at least essentially plane pump chamber floor, wherein the shape of the pump membrane and the shape of the pump chamber floor coincide when the pump membrane is in the second, i.e. essentially plane position, and, thus, provide a micro valve whose dead volume of the pump chamber is essentially only defined by the dead volumes of the valve wells.

Embodiments of the micro pump can comprise completely plane pump bodies, wherein the whole pump body (not only the part of the pump body defining the pump chamber floor) is essentially plane (e.g. plane except for the valve wells). Such completely plane surfaces or pump bodies are easy to produce, independent whether silicon or other semiconductor materials, metal or polymer materials are used for producing the pump body, and/or independent of how the input and output check valves are produced or integrated. Thus, such embodiments also allow to reduce the complexity of production engineering.

The dead volumes of the inlet and outlet check valves and/or the valve wells of the inlet and outlet check valve reduce—due to the arrangement of the inlet and outlet check valve opposite to the pumping membrane—the sticking effect and allow an easier removal of the pumping membrane from the pump chamber floor and the corresponding upwards movement of the pump membrane. Further embodiments of the micro pump comprise inlet and/or outlet check valves that are arranged opposite to a central area of the pumping membrane to further decrease the sticking effect and/or to decrease the flow resistance.

In further embodiments, the pumping membrane is directly bonded on the upper surface of the pumping membrane such that when the pump membrane is moved to the second position and assumes a plane shape, the pump membrane abuts to the upper surface also forming the pump chamber floor, except for, for example, the valve wells and/or recesses in the valve structures on the sides of the valves facing towards the pump chamber. "Directly bonded" in this context is to be understood that the pump membrane can be connected to the pump body with bonding material like, for example glue, or without bonding material (i.e. bonding material-less), for example using ultrasonic bonding, laser bonding, etc., however, without spacing layers or elements between the pump membrane and the pump body that would cause a gap between the pump membrane and the pump chamber floor when the pump membrane is in the second plane position.

Therefore, embodiments of the present invention provide micro pumps with a self-priming behavior, and are suitable for conveying compressible media like gasses and are, in addition, bubble-tolerant and bubble independent.

Micro pumps are considered bubble tolerant when they are adapted such that if a bubble is entering the pump chamber the micro pump is still working, and the bubble (or a part of the bubble) will be transported through the pump chamber. However, the pump rate can be changed, during the presence of the gas bubble (or parts of them) in the pump chamber.

Micro pumps are considered bubble independent when they are adapted such that if a bubble is entering the pump chamber, the micro pump is not only still working, but the pump rate is independent of the presence of gas in the pump chamber.

Methods for producing the pre-bulging of the membrane according to the present invention allow to implement particularly high extents of pre-bulging, e.g. large pre-bulging heights in relation to the lateral extension of the pump chamber, i.e. in relation to the diameter of the pump chamber, and, thus, facilitate not only high pump chamber volumes $V_{max}$ but also, and in particular, high stroke volumes $\Delta V$ and finally high compression ratios c.

In addition, embodiments of the method allow to manufacture or produce pre-bulged pump membranes or valve membranes—or in general to pre-stress membranes—without requiring additional processing steps, e.g. formation of an additional oxide layer.

BRIEF DESCRIPTION OF THE DRAWINGS

Embodiments of the present invention will be detailed subsequently referring to the appended drawings, in which:

FIG. 1B shows an embodiment of the micro pump, wherein the pump membrane itself is in a first pre-bulged position or state (in a non-actuated or rest state).

FIG. 1C shows the embodiment of the micro pump according to FIG. 1B in an second actuated position or state, wherein the pump membrane assumes a plane shape and abuts on the pump chamber floor.

FIG. 2A shows a cross-section of an embodiment of the micro pump with a piezo drive means mounted on a top surface of the pump membrane (in the first non actuated or rest state).

FIG. 2B shows a schematic cross-section of the micro pump according to FIG. 2A in the second actuated state.

FIGS. 3A, 3B show schematic cross-sectional views to explain a method of producing a micro pump.

Figure 1A:
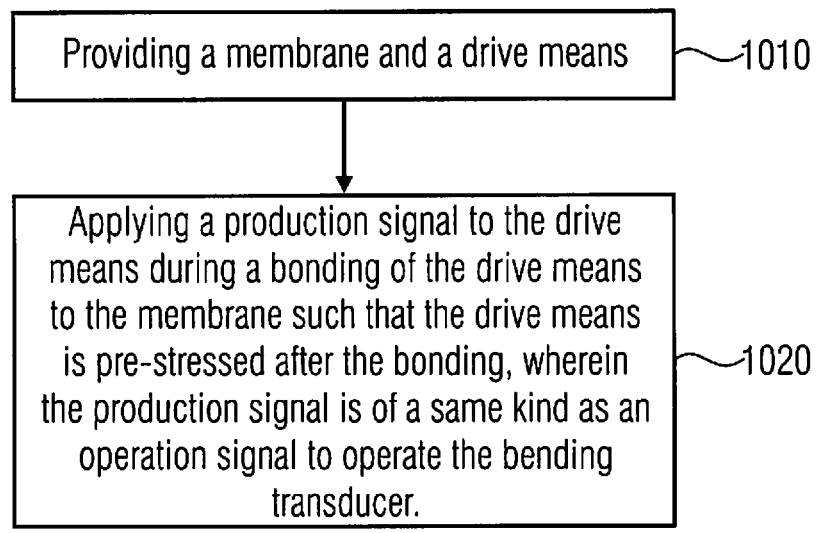
FIG. 1A shows a flow chart of an embodiment of a method for manufacturing a bending transducer.

Equal and/or equivalent elements are denoted in the following description of the figures by equal or equivalent reference numerals.

DETAILED DESCRIPTION OF THE INVENTION

FIG. 1A shows a flow chart of an embodiment of a method for manufacturing a bending transducer comprising a drive means and a membrane. In step 1010 the membrane and the drive means are provided. In step 1020 a production signal is applied to the drive means during the bonding of the drive means to the membrane such that the drive means is pre-stressed after the bonding, wherein the production signal is of a same kind of signal as an operation signal to operate the bending transducer. In other words, the production signal is of the same kind of signal as the operation signal applied to the drive means during the normal operation of the bending transducer to bend or deflect the bending transducer and membrane.

The production signal is advantageously only released after the bonding has been terminated or is applied during the whole bonding process.

The bonding itself can be performed by any suitable bonding technology. The bonding of the drive means to the membrane can be performed bonding-material-less or using bonding materials, for example by gluing using glue or soldering by using liquid solder. Independent of the specific bonding material, the bonding is performed by means of the bonding material arranged between the drive means and the membrane and the production signal is only released after the bonding material is hardened, advantageously completely hardened. In case the production voltage is released to early, for example before the bonding material is completely hardened, the drive means will change its size and, thus will decrease the extent to which the drive means is pre-stressed after the bonding.

As has been described previously, the application of the production signal leads to a change in the size of the drive means, in case of bonding transducers in a change of the dimension parallel to a surface of the drive means by which the drive means is bonded to the membrane. The change can be either a contraction or a extraction. Piezo actuators, for example, contract in case a positive voltage is applied and expand to a certain degree in case a negative voltage is applied. Embodiments, therefore, apply a positive production voltage to the piezo actuator to set the piezo actuator to a contracted state and keep the piezo actuator in the contracted state until the bonding is terminated. After the bonding and after releasing the positive production voltage, the piezo actuator tries to extract or expand to its normal size or dimension when not actuated, however, the piezo actuator is bonded over the whole main surface to the membrane trying to keep its present dimension in the lateral dimension, i.e. in the dimension parallel to the contact surface of the piezo drive means with the membrane. Thus, the piezo drive means, the membrane, or in general the bending transducer become pre-stressed.

In case the piezo actuator and the membrane are not mechanically connected to any periphery or are only connected on their border to a periphery, e.g. a micro pump or micro valve, the releasing of the production voltage effects that the piezo actuator expands, however not the normal size it would expand in case it would not be bonded to the membrane. On the other hand, the membrane is also expanded due to the piezo actuator. Thus, the piezo actuator is pre-stressed in the sense that the piezo actuator is pre-compressed compared to its normal dimension, whereas the membrane is pre-stressed in the sense that it is pre-stretched compared to its normal dimension. At the same time the drive means and the membrane are pre-bulged due to the pre-stressing in the direction towards the piezo actuator.

Figure 7A:
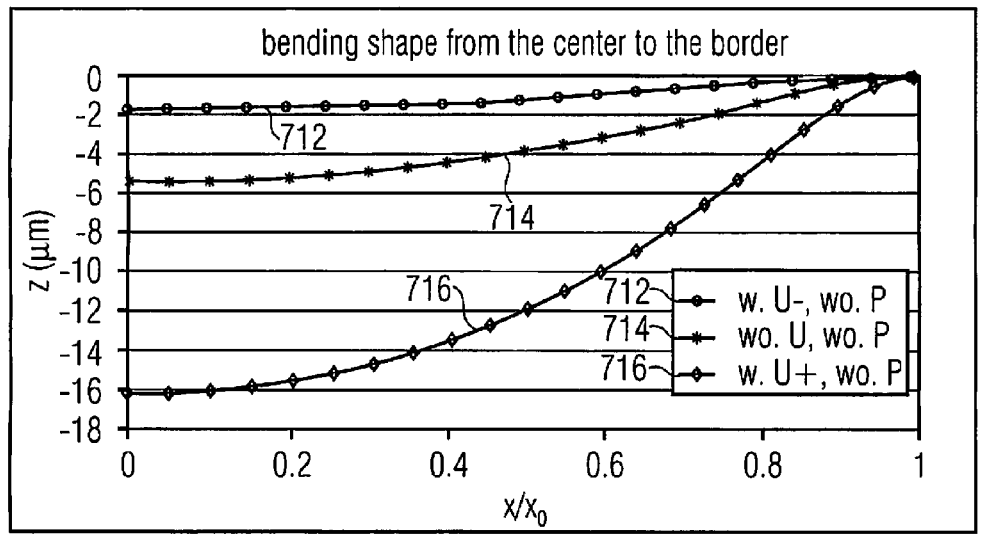
FIG. 7A shows a diagram of bending lines of a pump membrane from the center of the pump membrane to the border of the pump membrane for a piezo bonding at 80° C. without applying a production voltage.
Figure 7B:
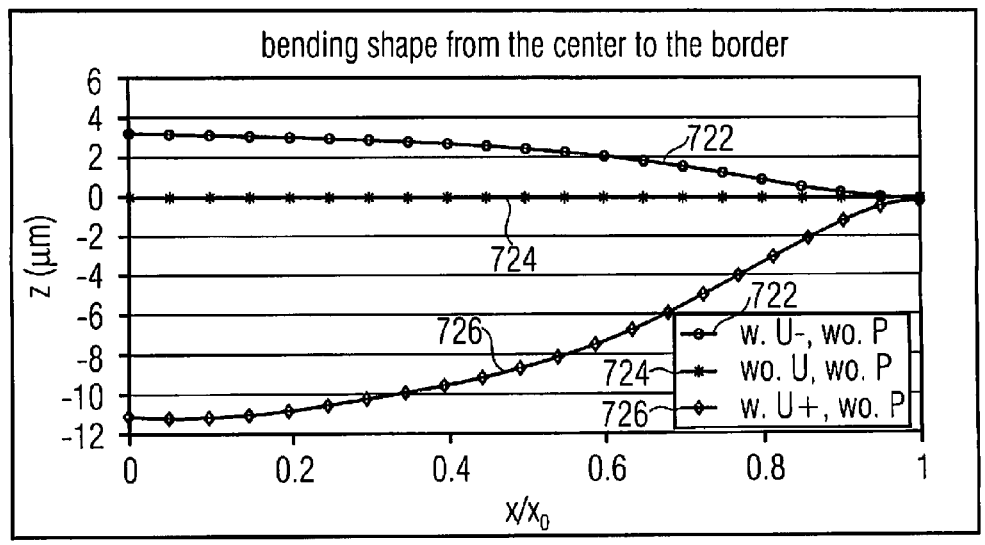
FIG. 7B shows a diagram of bending lines of a pump membrane from the center to the border of the pump membrane for a piezo bonding at 80° C. and a production voltage of 73.6 V.
Figure 7C:
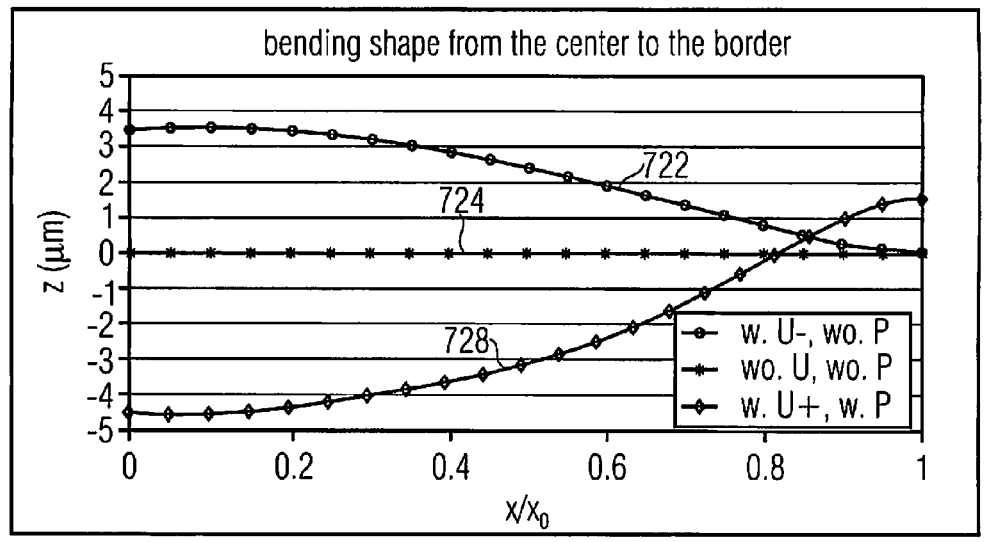
FIG. 7C shows a diagram of further bending lines of a pump membrane from the center to the border of the pump membrane for a piezo bonding at 80° C. and a production voltage of 73.6 V.
Figure 7D:
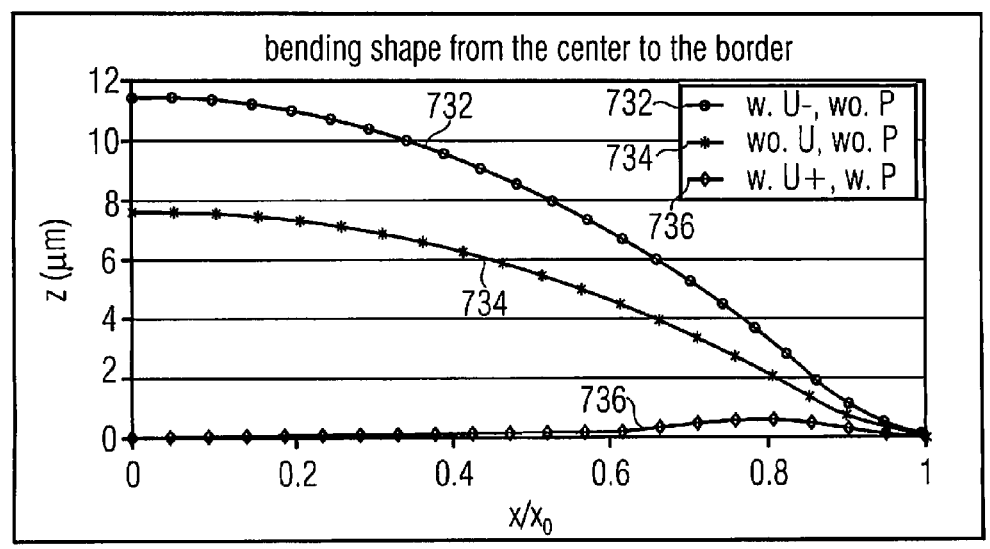
FIG. 7D shows a diagram of different bending lines of a pump membrane from the center to the border of the pump membrane for a piezo bonding at 80° C. and a production voltage of 178 V.
Figure 7E:
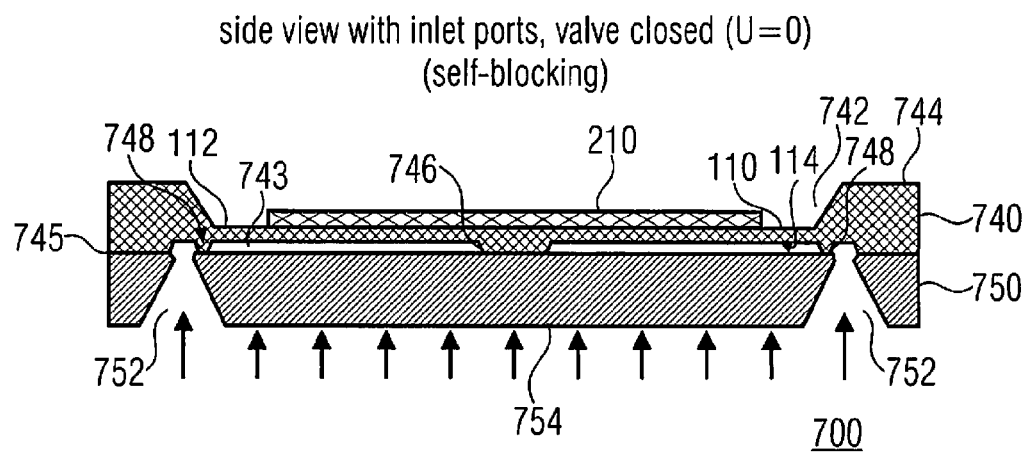
FIGS. 7E, 7F, 7FF, 7G show schematics of a normally closed valve with a pre-stressed bending transducer.
Figure 7F:
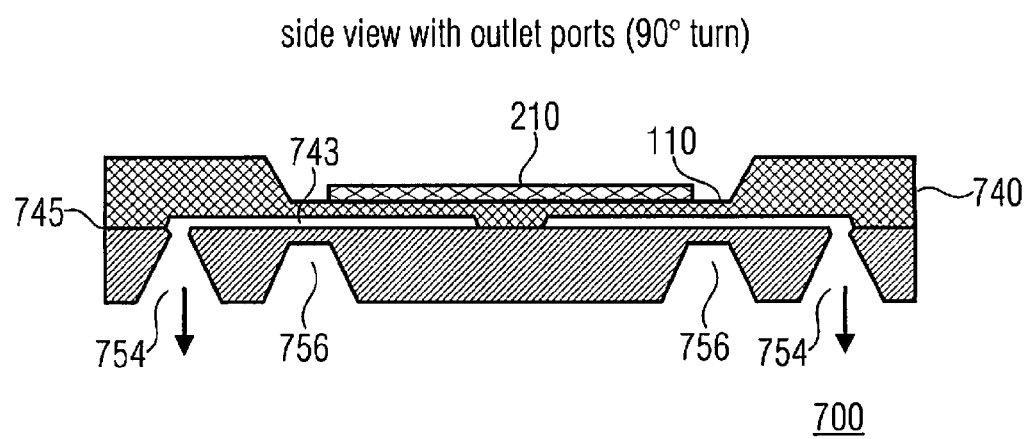
Figure 7F:
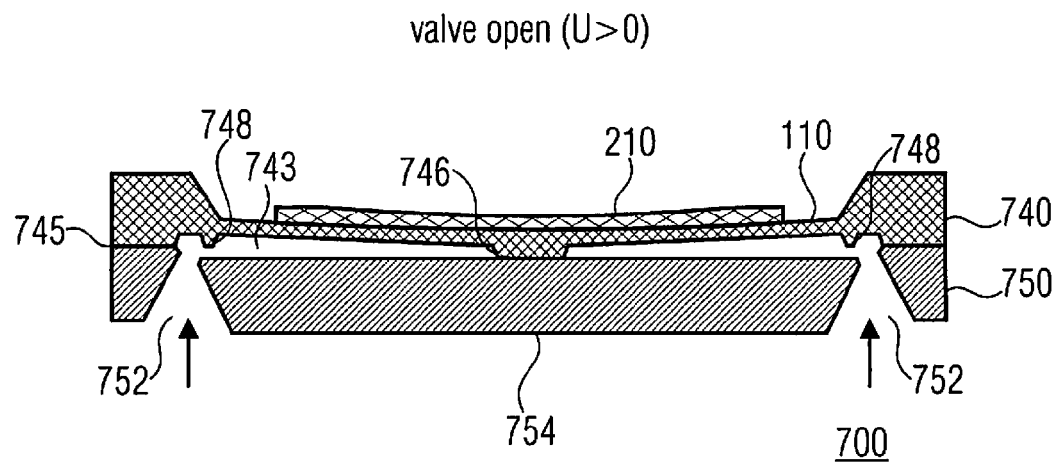
Figure 7G:
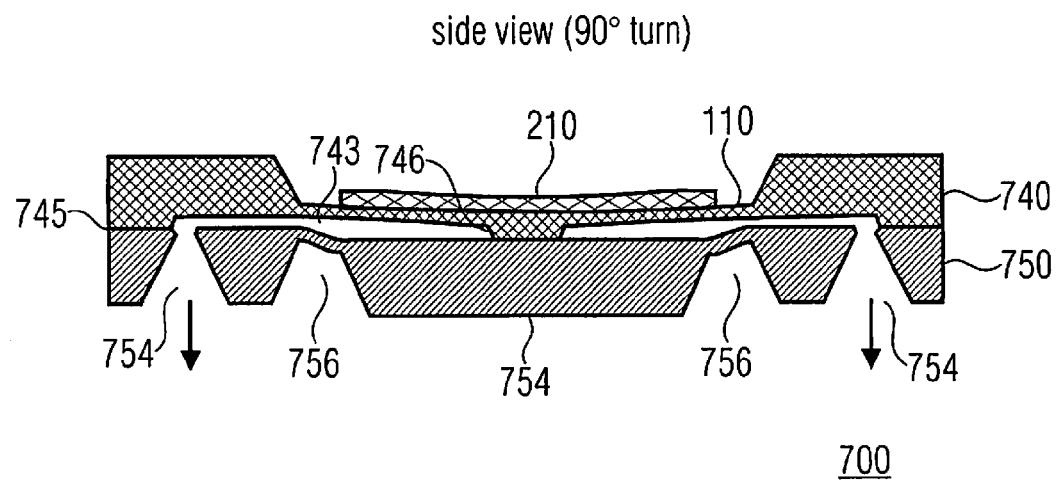
FIG. 7H shows a first embodiment of a normally open valve with a pre-bulged valve membrane.
FIG. 7I shows a schematic of a second embodiment of micro valve with a pre-bulged valve membrane.

In case the piezo actuator and the membrane are not only fixed at their border but, for example, also at their center (see for example the normally closed valves according to US 2004/0036047 A1, US 2006/0027772 A1 and FIGS. 7E-7G) the membrane and the piezo actuator cannot bend in a direction towards the piezo actuator, however, are pre-stressed and can be considered as being pre-stressed in a direction towards the piezo actuator (pre-stressed in the sense that the piezo actuator is compressed and prevents, for example, a unwanted pre-bulging in the downward direction due to other production parameters).

The same considerations apply to any other drive means usable for bending transducers.

In embodiments, using glue for bonding the drive means to the membrane, the glues often involve a certain predetermined production temperature higher than the normal ambient temperature. Thus, different temperature coefficients of the drive means and the membrane can cause additional pre-stressing that superposes to the pre-stressing caused by the production signal. In case a pre-stressing of the production signal and the pre-stressing caused by the different temperature expansion coefficients are of the same kind (for example both lead to a compression of the drive means after the bonding or both lead to a pre-stretching of the drive means after the bonding) the pre-stressing adds, whereas in case the pre-stressing of the production signal and the pre-stressing caused by the different temperature expansion coefficients are different, e.g. of an inverse or reverse kind (e.g., the pre-stressing by applying a production signal would cause a compression whereas as a pre-stressing caused by the different temperature coefficients would cause a pre-stretching, or vice versa) the pre-stressings may compensate each other at least partly.

It is a further finding of the present invention that this pre-stressing caused by the different temperature expansion coefficients of the drive means and the membrane can be used to either increase the pre-stressing and thus, for example, to achieve even higher pre-bulging heights and strokes, or to set the production signal to such a level and polarity that an unwanted pre-bulging in an unwanted direction caused by different temperature coefficients is at least partially compensated, fully compensated or even overcompensated to, for example, to achieve pre-bulging and strokes of a wanted dimension and direction.

In one embodiment, the temperature coefficient of the membrane (e.g. metal) is greater than a temperature coefficient of the drive means (e.g. piezo ceramics) and the production signal is such that the drive means is in a contracted state during the bonding. In this case the pre-stressing caused by both effects is of the same kind (compression of the drive means) and increases the achievable pre-stressing (pre-compression) and, depending on the mechanical fixation of the membrane and/or the drive means, also the achievable pre-bulging height.

In a further embodiment the temperature expansion coefficient of the membrane (e.g. silicon) is smaller than a temperature expansion coefficient of the drive means (e.g. piezo drive means) and the production signal is such that the drive means is in a contracted state during the bonding and the pre-stressing caused by the different temperature expansion coefficients is more than compensated by the pre-stressing caused by the production signal.

Alternative embodiments may use laser bonding or other bonding technologies to bond the drive means to the membrane and apply the production signal during the bonding as described above to achieve the pre-stressing of the bending actuator and potentially a pre-bulging.

Embodiments of the method for manufacturing can be easily implemented because existing bonding processes and technologies can be used. Only means for applying the production signal to the drive means during the step of bonding the drive means to the membrane have to be foreseen. This is further facilitated as the way the production signal is applied to the drive means can be the same as the operation signal is applied. For piezo actuators, for example, the same electrical connections used for applying the operating signal to the piezo actuator during normal operation (later in the field) can also be used for applying the production signal during the manufacturing or production.

In the following, embodiments of micro pumps comprising an embodiment of the bending transducer are described, wherein the membrane of the bending transducer forms the pump membrane.

FIGS. 1B and 1C show a schematic cross-sectional view of an embodiment of the micro pump comprising a pump membrane 110, a pump body 120 and a passive inlet check valve 130 and a passive outlet check valve 140. FIG. 1B shows a cross-sectional view of a first embodiment in a first bulged position. FIG. 1C shows the embodiment of the micro pump in the second less bulged position. In FIG. 1B the drive means that is adapted to drive the pump membrane from the first bulged position to the second less bulged position is not actuated. Therefore, the drive means (also driver or actuator; not shown in FIG. 1B) can also be referred to as being in a non-actuated state, non-activated state, inactive state or rest state, and this position or status of the micro pump and the pump membrane can also be referred to as non-actuated, non-activated, inactive or rest position or status. In FIG. 1C the drive means (not shown in 1C) is activated or actuated and has moved the pump membrane 110 to the second position. Therefore, with regard to the drive means, the pump membrane and the micro pump, this status or position can also be referred to as actuated or activated status or position.

The pump membrane 110 has a first or upper surface 112 and a second or lower surface 114 that is arranged opposite to the first surface 112. The pump body 120 comprises a first or upper surface 122 and a second or lower surface 124 that is arranged opposite to the first surface 122. The pump membrane 110 is connected at its circumference to the pump body 120, wherein the pump chamber 102 is defined as the space or volume between the pump membrane 110 and the pump body 120. The pump body 120 comprises an inlet 126 and an outlet 128 (pump inlet/pump outlet) and a cavity on the upper side of the pump body, i.e. the side facing towards to the pump membrane 110, in that the first valve 130 and the second valve 140 are arranged. The first valve 130 and the second valve 140 have a fluid connection, e.g. a direct fluid connection, to the pump chamber 102.

FIG. 1B shows an embodiment of the micro pump 100, wherein the inlet check valve 130 and the outlet check valve 140 are provided as a stack 170 of two semiconductor chips 150 and 160, wherein the upper semiconductor layer or chip 150 of the double valve structure 170 is arranged on top of the lower semiconductor layer or chip 160, and wherein the upper semiconductor layer 150 has been mechanically structured so as to provide a flap valve for the inlet check valve and the valve seat for the outlet check valve 140, and the lower semiconductor layer 160 has been structured so as to provide a valve seat for the inlet check valve and the valve flap of the outlet check valve. The first and/or second semiconductor layer 150 and 160 may comprise silicon or other semiconductor materials. Further details about such layered valve structures are described, for example, in U.S. Pat. No. 6,261, 066 B1. Other embodiments may comprise other inlet and outlet valves, e.g. active inlet or outlet valves, and may comprise materials other than semiconductor materials, e.g. metals or polymers.

As can be seen from FIGS. 1B and 1C, the first surface 122 of the pump body 120 is plane and a upper surface of the inlet and outlet check valve 130, 140, or in other words, an upper surface 152 of the upper layer 150 facing towards the pump membrane 110, is also plane and at the same height level with regard to a vertical orientation of FIG. 1B as the first surface 122. Below this common plane (defined by surfaces 152, 122), the inlet check valve 130 comprises cavities 132, for example cavities within the upper and lower layer 150, 160, and the outlet check valve 140 comprises cavities 142, for example within the upper layer 150, that are also referred to as "valve wells" 132 and 142.

Although FIGS. 1B and 1C show a pump body 120 with an inserted double valve structure 170, other embodiments of the micro pump may comprise valve structures 130 and 140 structured directly within the pump, or in other words, valve structures 130 and 140 directly integrated into the material of the pump body 120.

In other embodiments the upper surface 152 of the valve structure 170 may already form the pump body 120 (see for example FIGS. 4A-4F and 5A-5B).

In the following the first surface 122 of the pump body 120 and the upper surface 152 of the inlet and outlet check valves 130 and 140 will also be jointly referred to as the first surface of a pump body or as pump chamber floor. Thus, the micro pump 100 according to FIGS. 1B and 1C comprises an essentially planar first surface 122 or essentially planar pump chamber floor, i.e. a first surface that is plane except for the cavities 132 and 142 of the valve wells.

Within this context it should be mentioned that the maximum volume $V_{max}$ of the pump chamber 102 comprises the volume between the pump body 120 and the pump membrane 110 as shown in FIG. 1B (in the pre-bulged state) and the volumes of the valve wells 132 and 142. As can be further seen from FIG. 1C, in embodiments wherein the pump membrane 110 assumes a plane shape within the second less bulged position, and abuts to the first surface 122 of the pump body 120, the minimum or dead volume $V_0$ is essentially defined by the volumes of the valve wells 132 and 142. The difference between these two volumes is also referred to as the stroke volume $\Delta V$, i.e. $\Delta V = V_{max} - V_0$. As the compression ratio c is defined as $c = \Delta V / V_0$, embodiments of the micro pump according to FIG. 1B-1C provide high compression ratios.

As can be further seen from FIG. 1B, reference sign H refers to the height of the pump chamber in the non-actuated state, i.e. the vertical distance between the first surface 122 of the pump body and the lower surface 114 of the pump membrane in the center 104 of the pump membrane. The diameter D of the pump chamber or micro pump is defined by the distance between two opposed lateral positions of the micro pump at which—in the non-actuated pre-bulged state—the pump membrane 110 touches the pump body, which typically coincides with the positions as which the pump membrane 110 is connected at its circumference to the pump body 120.

The pump chamber 102 is completely sealed from the environment (except for the inlet check valve 130 and the outlet check valve 140) via a connection between the pump membrane 110 and the pump body 120 at the circumference of the pump membrane 110.

The circumference of the pump membrane 110 may have an angular form, any point symmetric geometric form or any other form. Angular and point symmetric circumferences provide improved pumping characteristics as they avoid distortions during the movements.

Figure 1D:
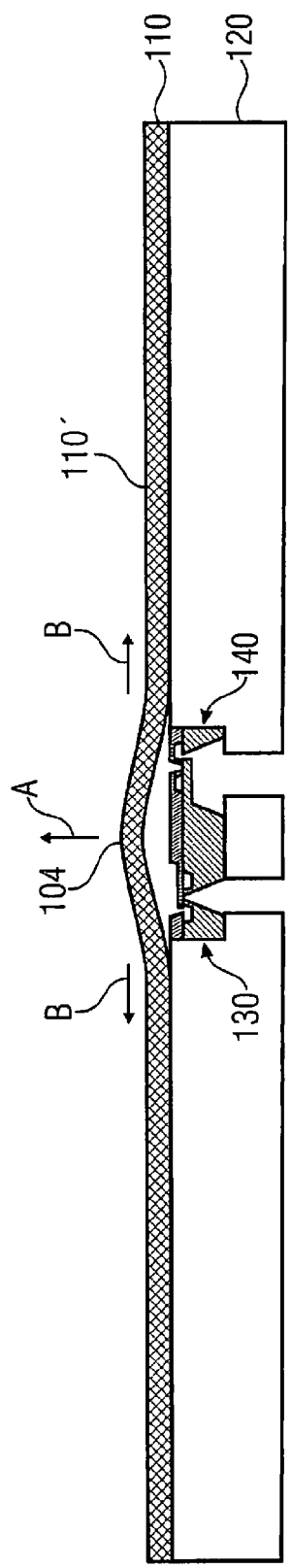
FIG. 1D shows an intermediate shape of the pump membrane when moving from the second less bulged, here plane shape, to the first bulged shape.

FIG. 1D shows a schematic cross-sectional view of the pump membrane 110 in an early intermediate state 110' when moving from the second plane state to the first pre-bulged state (see arrow A). When the drive means is not actuated anymore, the pump membrane 110 starts to reassume the pre-bulged state. The upwards movement of the pump membrane 110 starts, for example, at the center 104 of the pump membrane by forming the small bulge shown in FIG. 1D that increases in height (see arrow A) and extends laterally (see arrow B) to finally arrive at the fully pre-bulged position as shown in FIG. 1B. A typical problem of micro pumps is that the pump membrane 110 tends to stick to the pump body 120 once it abuts to the pump body 120. The arrangement of the inlet check valve 130 and the outlet check valve 140 opposite to and below the pump membrane 110 reduces this sticking effect due to the pump wells formed by these valves. Further embodiments comprise inlet valves 130 and outlet check valves 140 that are arranged in a central area 126 that extends from the center of the membrane and the corresponding center of the pump body 120. As can be seen from FIG. 1D, such a central arrangement of the inlet check valve and the outlet check valve with their corresponding valve wells allows an easier forming of initial bulging shapes 110' as shown in FIG. 1D and, thus, further reduces the sticking effect. The diameter of the central area 126 may be in the range of less than 70% of the diameter D, less than 50% or less than 30% of the diameter D of the pump chamber 102.

For embodiments of the micro pump which move the pump membrane 110 between the first pre-bulged position, for example as shown in FIG. 1B, and a plane second position, as for example shown in FIG. 1C, the height H of the pump chamber 102 also represents the stroke distance or stroke height.

The pump chamber volume $V_{max}$ and the stroke volume $\Delta V$ can be increased by increasing the diameter D of the pump chamber and/or by increasing the stroke height H. As will described later, embodiments of the method of producing the micro pump allow to produce micro pumps with large diameters D, high stroke heights H and high ratios between the stroke height H and the pump chamber diameter D.

Embodiments of the micro pump, or of the bending transducer in general, and the methods for producing the micro pump may comprise one or more piezo drive means, e.g. monomorph piezo elements, multilayer piezo elements or piezo stack elements, or any other drive means that is adapted to contract laterally when a certain drive signal, also referred to as operation signal or activation signal, or a production signal is applied thereto. These drive signals can be drive voltages (e.g. for the piezo drive means), drive currents, or any other physical measures to suited to drive the drive means. The same applies to the production signals.

FIGS. 2A and 2B show schematic cross-sectional views of an embodiment of the micro pump 200 comprising a piezo drive element 210 connected to the top 112 of the pump membrane 110. FIG. 2A shows, analogous to FIG. 1B, the micro pump with the pump membrane 110 in the first pre-bulged position and FIG. 2B the same in the second less bulged position, in this case plane position. The piezo drive element 210 comprises a top electrode on the first surface 212 (also upper or top surface) and a bottom electrode on the second surface (also lower or bottom surface) of the piezo drive element 210, wherein the second surface 214 is arranged on the opposite main surface of the piezo drive element 210 (electrodes not shown). The top electrode of the piezo drive element 210 is electrically connected to a first contact 216 and the bottom electrode of the piezo drive element 210 is electrically connected to a second contact 218 of the micro pump, for example via a conductive coating arranged at least on a part of the first surface 112 of the pump membrane. The piezo drive element 210, can for example be bonded to the pump membrane 110 via glue or other bonding techniques. The piezo drive element is polarized such that in case a positive voltage is applied between the top electrode 216 and the bottom electrode 218, respectively the first contact 216 and the second contact 218, the piezo drive element contracts laterally, and thus bends the pre-bulged pump membrane 110 down to the pump body 120. In FIG. 2A no voltage (U=0) is applied to the electric contacts 216, 218. In other words, the piezo drive element is not activated and the pre-bulged pump membrane 110 assumes its pre-bulged position. In FIG. 2B a positive voltage, for example U=U$_{max}$, is applied so that the pump membrane 110 is bent downwards to the plane pump body 120 and abuts on the latter.

Embodiments of the micro pump are based on the idea that a pump membrane or driving membrane is bonded onto an essentially plane pump chamber floor, or a pump chamber floor that comprises a lowering that is smaller than the pre-bulging height H of the pump membrane in upward direction, wherein the pump membrane is pre-bulged upwards and the valve unit 170, for example the valve structure 130, 140, is comprised within the pump chamber floor. The distorted or pre-distorted (i.e. pre-bulged) membrane can be distorted or moved in direction to the pump chamber floor such that the pump membrane abuts plane on the pump chamber floor (see FIGS. 1C and 2B). The dead volume V$_0$, is thus essentially only defined by the remaining dead volumes of the valve wells 132, 142.

The movement of the pump membrane 110 from the first pre-bulged position to the second plane position can be achieved in various ways, for example, via piezo ceramics 210 or other piezo drives, for example, piezo stack actuators, glued on top of the pump membrane, as discussed based on FIGS. 2A and 2B, contracting laterally when a positive voltage is applied, relaxing laterally when no voltage is applied and expanding beyond the lateral length or dimension of the relaxed state when a negative voltage is applied.

In further embodiments the emission of the force onto the pump membrane to bend down is applied via a piezo-stack actuator that is permanently bonded to the pump membrane.

The valve wells of silicon micro-valves according to, for example, U.S. Pat. No. 6,261,066 B1, comprise a remaining dead volume of about 360 nanoliters (0.36 microliter). A pump membrane with a pre-bulged shape similar to a bulged shape of the pump membrane of, for example, a micro pump according to the U.S. Pat. No. 6,261,066 B1, with a diameter D of 30 mm, allows to generate a stroke volume of about 22 microliters. Therefore, the compression ratio c is 22/0.36=61. This compression ratio is multiple times higher than the compression ratios of known micro pumps that lie within a range of 0.1-1.0. Through optimization a compression ratio can be even further increased as the valves of the aforementioned silicon micro pump can be further optimized with regard to their dead volume. Thus, it is, for example, possible to produce silicon valves with a remaining dead volume of about 50 nanoliters. By increasing the pump chamber the stroke volume can be increased to, for example, 50 microliters. Thus, a compression ratio of 50 microliters/50 nanoliters=1000 can be achieved. In combination with a correspondingly strongly dimensioned piezo drive, micro pumps can be provided that are capable of either creating high negative pressures that are near to vacuum conditions, or for creating very large positive pressures of several hundred bars.

In the following, embodiments of methods of producing embodiments of the inventive micro pump are described.

An example of a method for producing the micro pump that can be combined with a method according to FIG. 1A will be described based on FIGS. 3A and 3B. According to the example, the drive means, for example a piezo drive means, is bonded on top of the pump membrane and the pump membrane is pre-bulged due to different temperature expansion coefficients of the piezo driver and the pump membrane. The pump membrane 110 is, for example, already bonded onto the pump body 120, the pump body, for example already comprising the inlet check valve 130 and the outlet check valve 140. The pump chamber floor can, for example as shown in FIG. 3A, be plane or at least essentially plane as shown in FIG. 3A, and the pump membrane can be bonded to the pump body in a plane shape. In addition to the aforementioned structure comprising the pump body and pump membrane, the drive means, for example the piezo driver, is provided and arranged on top of the pump membrane 110 with a layer of glue 320 between the piezo driver 210 and the pump membrane 110. The glue 320 can, for example, be put onto the lower surface of the piezo driver or on the upper surface of the pump membrane. The piezo driver is pressed at a predetermined production pressure, for example using a silicon stamp 310, onto the pump membrane to equally distribute the glue and to achieve a thin glue layer 320. The glue is hardened at an increased production or bonding temperature T$_{production}$.

The heating of the pump body 120, the pump membrane 110 and the piezo driver 210 can be started before the piezo driver 210 is mounted onto the pump membrane 110, or after the piezo drive means has been positioned (including the glue) on top of the pump membrane 110, however the hardening of the glue is performed at the production temperature T$_{production}$.

After the hardening of the glue of the pump device (comprising the pump body, the pump membrane and the piezo drive means) is cooled down. As the temperature expansion coefficient of the piezo drive element (i.e. of a material the piezo drive element comprises or consists of), for example a piezo ceramic, $\alpha_{piezo}$ is smaller than the temperature expansion coefficient $\alpha_{membrane}$ of the pumping membrane (i.e. of a material the pumping membrane comprises or consists of), the contraction of the pump membrane is larger than the contraction of the piezo driver bonded on top of the pump membrane, and, thus, the drive unit comprising the pump membrane and the piezo driver is bulged upwards (when the piezo driver is not actuated).

Micro pumps according to the example of the method of producing the micro pump can, for example, comprise pump membranes with metals or metal alloys as pump membrane material, for example with temperature expansion coefficients in a range of 10 to 25 times $10^{-6}$/K at 20° Celsius, or synthetic materials and/or polymers, for example with temperature expansion coefficients in a range of 10 to 250 times $10^{-6}$/K at 20° Celsius, and piezo drivers, for example piezo ceramic drive elements, for example with temperature expansion coefficients in a range of 2 to 7 times $10^{-6}$/K at 20° Celsius.

The temperature expansion coefficient of the pump membrane can be more than five times higher or more than ten times higher than the temperature expansion coefficient of the drive means. The higher the aforementioned ratio between the temperature expansion coefficient of the pump membrane and the temperature expansion coefficient of the drive means, the higher the extent to which the pump membrane 110 is pre-bulged and, accordingly, the higher the height H, the stroke height H, the stroke volume ΔV and, finally, the compression ratio.

The bonding of the piezo ceramics 210 to the membrane 110 and the hardening of the glue at the production temperature can be performed after the pump membrane has been bonded to the pump body (as described above) or before the bonding of the membrane to the pump body is performed.

FIG. 3A shows the bonding of the piezo ceramics 210 onto the top of the pump membrane 110, the application of the production pressure (see arrows 312) in FIG. 3A via a silicone stamp 310, and the hardening of the glue 320 at the production temperature T$_{production}$. FIG. 3B shows the pre-bulged membrane 110 that is pre-bulged due to the different temperature expansion coefficients after the pump has been cooled down (glue not shown in FIG. 3B).

An embodiment of a method of producing a micro pump according to FIG. 1A will be described based on FIGS. 4A to 4F. FIGS. 4A to 4F show schematic cross-sectional views of a production of a micro pump with a pre-bulged pump membrane, wherein the two-layer-valve structure 170, as for example described in context with FIG. 1B, forms the pump body 120, and wherein the pump membrane is provided as a structured and thinned third layer 410.

Figure 4A:
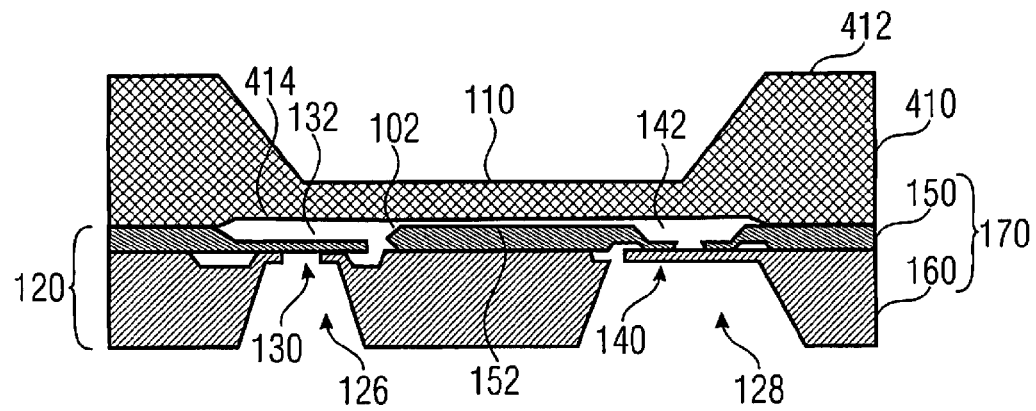
FIG. 4A-4F show schematic cross-sectional views which explain an embodiment of the method for producing a micro pump.

As can be seen from FIG. 4A, the third layer 410 is thinned in a central area of its upper or first surface 412 to provide a flexible pump membrane 110. As can be further seen from FIG. 4A, the third layer 410 has also been slightly thinned on the lower or second surface 414 arranged opposite to the first surface 412 in a further central area or region with a diameter, for example, larger than the diameter D of the central area. A pump membrane 110, respectively, the third layer 410 and the pump body 170 are connected to each other such that the pump chamber 102 is defined between the pump body and the pump membrane.

In further embodiments, the third layer may comprise a plane second or lower surface 414 (i.e. no cavity in the central area in the pump chamber region, or in other words, no spacing structure at the circumference of the lower surface of the third layer or an equivalent spacing structure on the top surface of the pump body) so that the pump membrane 110 abuts in the central part of the pump body to the upper surface or pump chamber floor before the pre-bulging is performed. The remaining dead volume of such embodiments is essentially only defined by the valve wells 132 and 142.

The production of such layered pump structures is, for example described in U.S. Pat. No. 6,261,066. The three layers 150, 160 and 410, for example, comprise semiconductor materials, for example silicon, or other materials.

In other words, in FIG. 4A the micro pump before pre-bulging and before bonding the piezo ceramics to the membrane is shown.

Figure 4B:
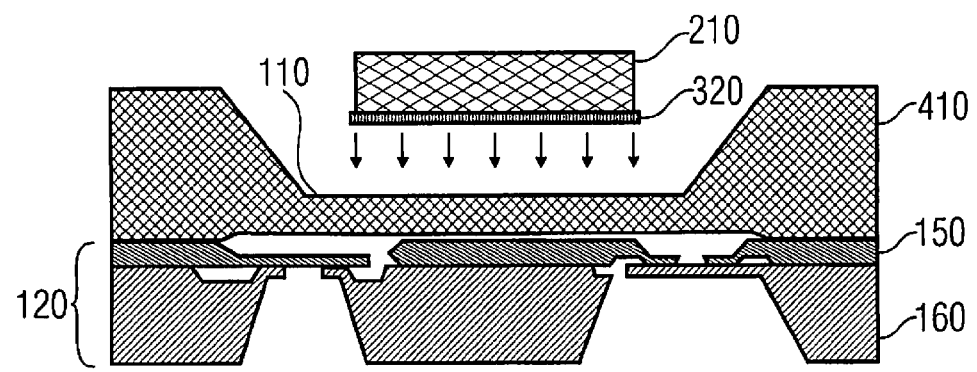

In FIG. 4B the piezo ceramics 210 with a layer of glue 320 on its bottom surface is placed on the top surface 412 of the membrane 110.

Figure 4C:
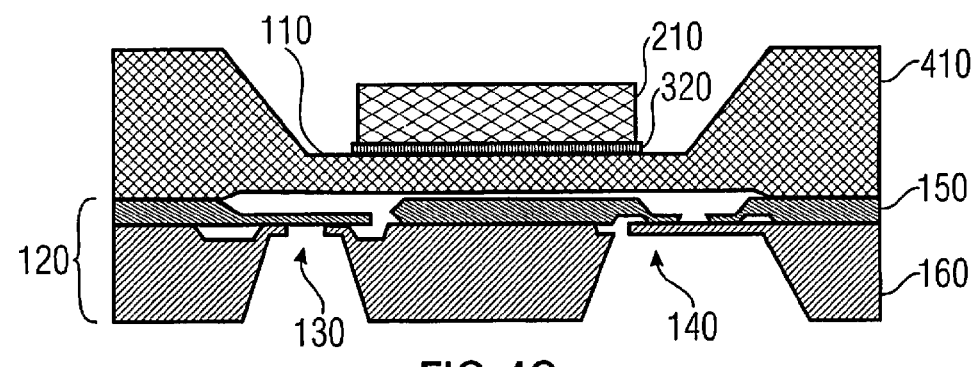

FIG. 4C shows the micro pump structure with the piezo ceramics 210 positioned on the membrane 110 and the layer of glue 320 between the piezo ceramics and the pump membrane.

Figure 4D:
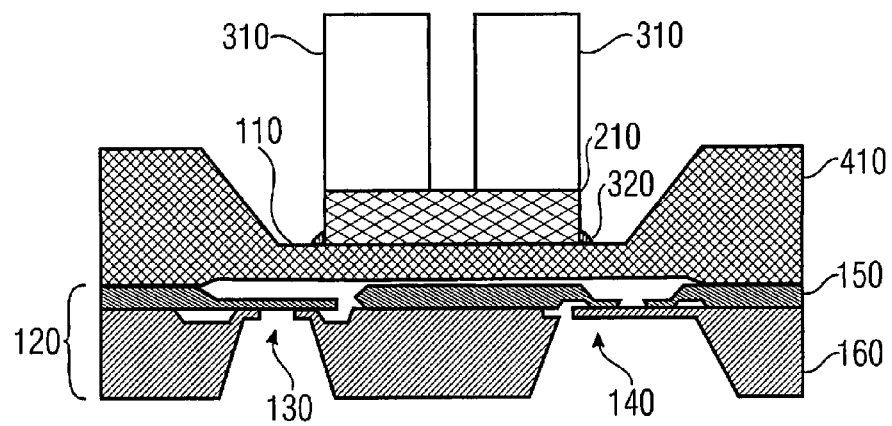

In FIG. 4D the piezo ceramics 210 is pressed at a predetermined production pressure onto the pump membrane 110, for example, using a silicone stamp 310. The production pressure is such that the glue 320 is advantageously essentially equally distributed over the connecting surface of the piezo ceramics and the pump membrane and provides a glue layer thickness that is small enough to allow peak contacts between the conductive layer on the top surface of the membrane and the bottom electrode of the piezo ceramics, to electrically connect both. The peak contacts allow to use insulating or non-conductive glue for bonding the piezo drive means to the pump membrane and still electrically connect the lower electrode of the piezo drive means. It should be mentioned that in the steps depicted by FIGS. 4C and 4D the glue is not yet hardened.

Figure 4E:
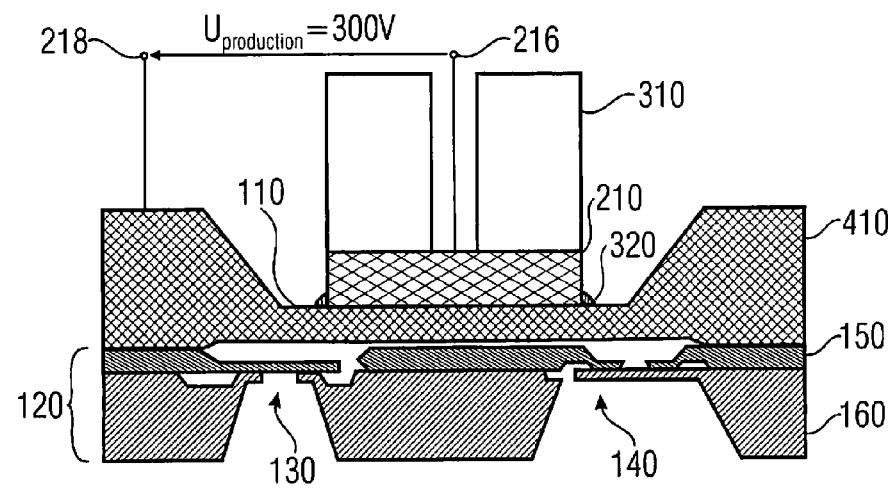

In FIG. 4E a production voltage $U_{production}$ is applied to the piezo drive means 210 (e.g. piezo ceramics or piezo stack actuator) such that the piezo drive means contracts. After the contraction or shrinking of the piezo drive the glue is hardened while applying a production voltage $U_{production}$ and also maintaining the production pressure via the silicon stamp 310.

After the glue has hardened, the production voltage and the pressure are released.

In other words, the piezo ceramics is glued onto the pump membrane, wherein during the hardening of the glue a positive production voltage $U_{production}$ is applied to the piezo drive element. Thus, the piezo drive means ceramics contracts and is bonded to the membrane in the contracted state. The production voltage is only released after the glue has hardened.

Figure 4F:
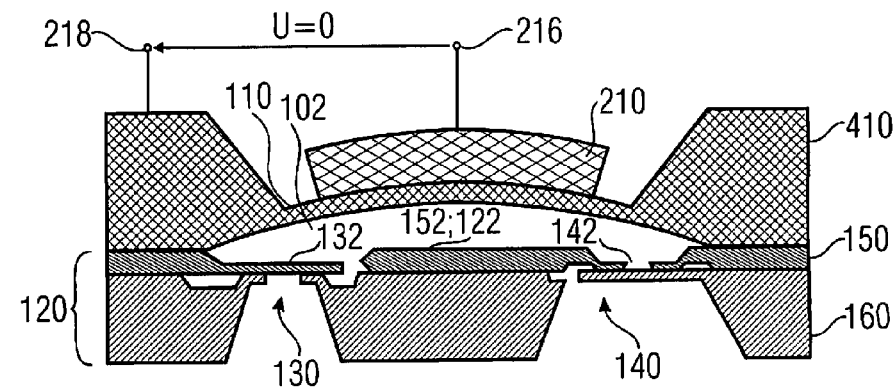

After the voltage has been released, the piezo ceramics wants to relax or extract again, thus, causing the pre-bulging of the drive unit (i.e. pump membrane and piezo ceramics) as shown in FIG. 4F (glue not shown in FIG. 4F).

Thus, the pump structure of FIG. 4A has been modified to comprise a pre-stressed or pre-bulged membrane or diaphragm. Depending on the pump chamber volume and the dead volume, such embodiments can achieve high compression ratios as has been explained before.

Although an embodiment of the method of producing the micro pump has been described with the membrane 410 already bonded to the pump body 170, in alternative embodiments the pre-bulging (i.e. the positioning of the piezo ceramics and the hardening of the glue at the production voltage) can also be performed before the pump membrane or the third layer is bonded to the pump body.

Figure 5A:
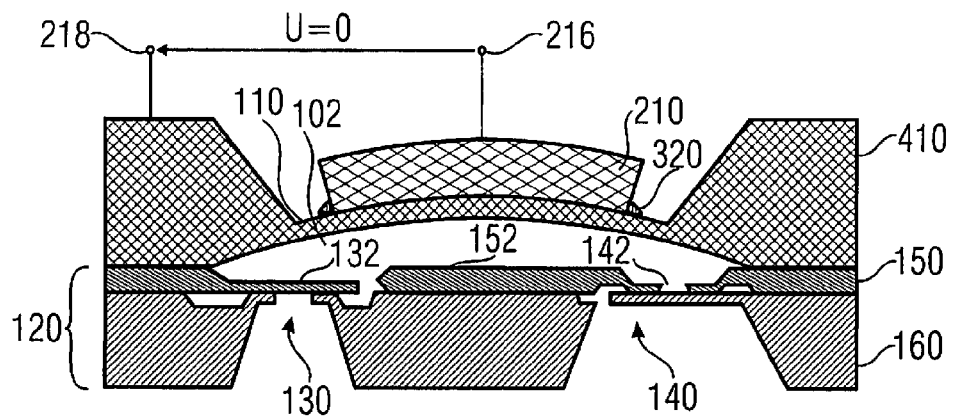
FIGS. 5A, 5B show schematic cross-sectional views of the micro pump produced according to the method described based on FIGS. 4A-4F in a non-actuated and in an actuated state.
Figure 5B:
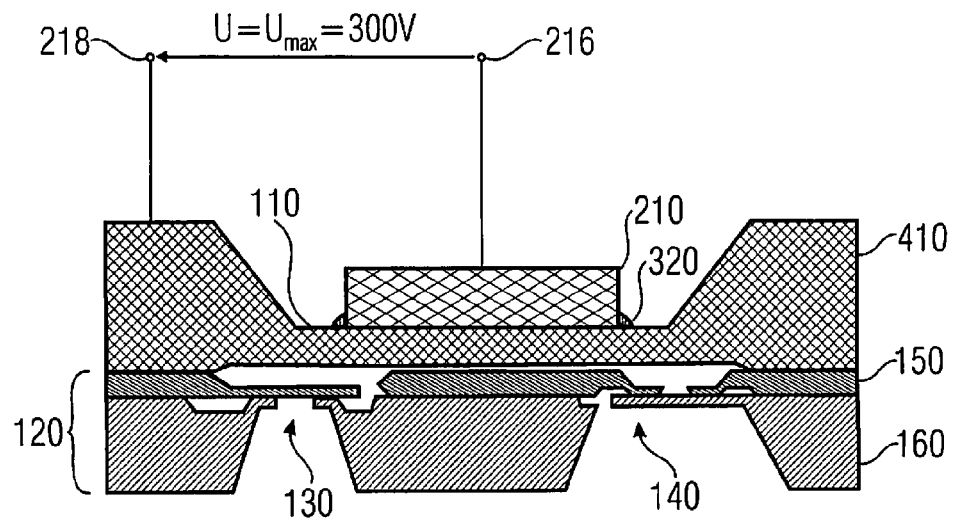

FIG. 5A shows a schematic cross-sectional view of the micro pump produced by the method according to the FIGS. 4A to 4F. FIG. 5A shows the micro pump with the pre-bulged membrane 110 in a non-actuated state (U=0V). FIG. 5B shows the micro pump of FIG. 5A in an actuated state, wherein the pump membrane 110 has an essentially plane shape. The pump membrane 110 can, for example be moved to the second plane position by applying an operation voltage U which is equal to the production voltage $U_{production}$, for example 300 V, in case no counter pressure or back pressure is applied. In case counter pressure is applied, the operation or actuating voltage U can be increased to voltage values higher than the production voltage $U_{production}$, to create sufficient pressure within the pump chamber to overcome the threshold pressure difference at which the output check valve 140 opens and a fluid within the pump chamber can be pumped out of the micro pump.

As mentioned previously the method as described based on FIGS. 4A to 4F can also be combined with a method as described based on FIGS. 3A and 3B and provides a further embodiment of a method for producing a micro pump, and also allows to achieve the pre-bulging of the pump membrane.

In the aforementioned embodiment the pump membrane is pre-stretched by the drive means, due to the different thermal expansion coefficients and/or due to the extraction of the piezo drive means after the production voltage has been released. Thus, when the drive means is actuated and bends down the pump membrane, the stress of the pump membrane due to the stretching is partly or completely released, e.g. when the pump membrane is in the second plane position.

Embodiments of the micro pump using piezo drive means, for example, piezo ceramics, i.e. piezo stacks, provide—compared to electrostatic or electromagnetic drive means—large stroke forces and stroke lengths or heights at comparably low voltages.

To reduce the sticking effect or to avoid the sticking of the pump membrane to the pump body when the pump membrane abuts to the pump body, star like arranged recessions extending radially, for example, from the input check valve or the respective valve well can be arranged, or small hubs or protrusions extending from the pump chamber floor or the pump membrane into the pump chamber can be implemented.

Although predominately embodiments of the micro pump have been described that comprise input check valves and output check valves 130 and 140 made of semiconductor materials, for example, silicon, other embodiments of the micro pump may comprise similar or different passive inlet and outlet check valves comprising different materials, for example metals or polymers independent of the pump body they are integrated into.

Furthermore, although embodiments of the micro pump have been described that comprise input check valves and output check valves 130 and 140 integrated or arranged in the pump body, alternative embodiments may comprise valves that are arranged, e.g. laterally between the pump membrane and the pump body.

Even further embodiments of the micro pump may comprise a pump body in that the inlet and outlet check valves are integrally formed, as, for example, has been described based on FIGS. 4A to 5B.

Even other embodiments may comprise pump bodies with integrally formed valve inlet and valve outlet structures 130 and 140 comprising materials like steel, stainless steal or spring stainless steel, synthetic materials or polymers, wherein these pump bodies may comprise single or multiple layers to form the valve structures. Therefore, further embodiments of the micro pump may comprise pump bodies and pump membranes made of metals, synthetic materials or polymers or stack structures thereof. In comparison to silicon pump bodies and pump membranes, pump bodies and pump membranes made of metals or polymers are less costly in production and provide higher flexibility and, for example, lower Youngs' modules.

Other embodiments of the invention provide a micro pump with a driving membrane, wherein the driving membrane moves between a upwardly pre-bulged or pre-distorted position and an essentially plane position, wherein the uneven sections on the surface arranged facing towards the pump membrane of the pump body are smaller than a stroke height H of the membrane.

Such micro pumps may comprise driving membranes that are pre-bulged in upward direction. Such embodiments may comprise piezo ceramics bonded onto the driving membrane.

Such embodiments of the micro pump can further comprise a membrane moved between the two positions by a piezo stack actuator, wherein the membrane is permanently bonded to the piezo stack actuator.

In the following, the results of several simulations of the shape of the pumping membrane will be discussed to explain further aspects and/or advantages of embodiments of the present invention.

The bending shapes of the pump membrane have been calculated for a silicon piezo pump (a micro pump with a pump membrane comprising or consisting of silicon and a piezo drive means as drive means) using finite element analysis. For the micro pump geometry, the following parameters have been used: a quadratic silicon pump membrane with a side length of 6.3 mm and a thickness or height of the pump membrane itself of 50 mm, a piezo drive means with a thickness or height of 150 mm, wherein the ratio of the side lengths of the piezo drive means is 0.8 with regard to side lengths of the pump membrane. The bending shape is shown parallel to the axis through the membrane centre from the centre to the border of the pump membrane.

The bending shapes of the pump membrane have been calculated for a silicon piezo pump (a micro pump with a pump membrane comprising or consisting of silicon and a piezo drive means as drive means) using finite element analysis. For the micro pump geometry, the following parameters have been used: a quadratic silicon pump membrane with a side length of 6.3 mm and a thickness or height of the pump membrane itself of 50 mm, a piezo drive means with a thickness or height of 150 mm, wherein the ratio of the side lengths of the piezo drive means is 0.8 with regard to side lengths of the pump membrane. The bending shape is shown parallel to the axis through the membrane centre from the centre to the border of the pump membrane.

Different characteristic bending shapes have been determined for the cases where the formation of the bending shape is caused by (1a) only by thermo mechanical tensions caused by the different temperature expansion coefficients of the used materials, (1b) only by the bender actuator effect through applying an electric field to the piezo drive means, (2) only the effect of an application of a pressure (difference pressure between the upper and the lower side of the pump membrane), and (3) only the bender actuator effect due to a structured oxide layer with intrinsic tension (structure: oxide layer instead of the piezo drive means at the same position).

Figure 6:
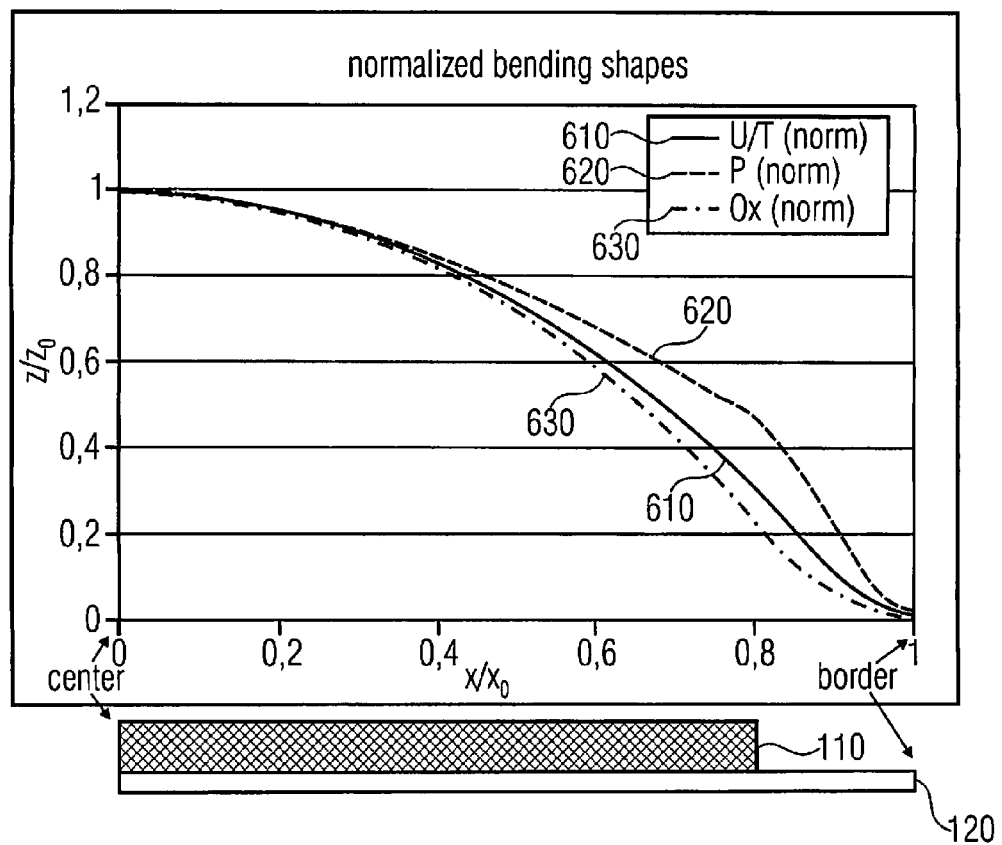
FIG. 6 shows a diagram of normalized bending lines (half-pump membrane) from the center of the pump membrane to the border of the pump membrane for different bulging effects or bulging causes.

The cases (1a) and (1b) are identical with regard to their effect and the characteristic bending shape and will be summarized as case "U/T". Case (2) will be referred to as case "P" and case 3 will be referred to as "Ox". In FIG. 6, the bending shapes of these three aforementioned "pure cases" are shown in a normalized manner, i.e. the height z scaled to the maximum bending value $z_o$ for the corresponding case and the lateral position x scaled to the length $x_o$ of the silicon membrane. In the lower part of diagram of FIG. 6, the pump membrane 120 with the length $x_o$ (from the centre to the border) is shown and the length of the piezo drive means from the centre to 0.8 of the length of the pump membrane is shown (side length ratio 0.8). In FIG. 6, the reference sign 610 refers to the case U/T, reference sign 620 to the case P and reference sign 630 to the case Ox. FIG. 6 shows the normalized bending shapes for half of the pump membrane (from the centre to the border) for the different bending effects or cases.

In a first approximation, all these effects of the temperature, the pressure and the oxide tension with regard to the bending (bending shape) and of the displaced volumes are linearly scalable and linearly super-positional.

In the following, the bending of the pump membrane and the displaced volumes or stroke volumes are discussed with regard to their absolute values. The parameters for the simulation are, for the silicon membrane: lateral area or surface of 6300×6300 mm², a thickness of 50 mm, a Youngs modulus of 166 GPa (Poisson value 0.3), and for the piezo drive means: lateral width and length of the piezo drive means being 0.8 of the lateral width and length of the silicon membrane, a thickness of 150 mm, a Youngs modulus of 90 GPa (Poisson value 0.3). The temperature expansion coefficients α being for silicon $0.3 \times 10^{-6}$/K and for the piezo drive means $5 \times 10^{-6}$/K (difference of $2.7 \times 10^{-6}$/K). The d31 coefficient of the piezo drive means being $330 \times 10^{-12}$ m/V.

FIG. 7A shows a diagram of the bending shape of a conventional-technology pump membrane from the centre (left-hand side of the diagram) to the border (right-hand side of the diagram) with the lateral dimension x normalized to the half length or width $x_0$ of the pump membrane and the vertical dimension z shown as absolute value in micrometers. FIG. 7A shows the bending shape at 20° C. and −50 V (reference sign 712) at 0 V (reference sign 714) and at 150 V (reference sign 716) without pressure (P=0) in case the piezo drive means has been mounted or assembled at 80° C. without applying a production voltage ($U_{production}$=0). Within the Figs. the abbreviation "w." is used for "with" and the abbreviation "wo." for "without".

As can be seen from FIG. 7A, in case the bonding of the piezo drive means to the pump membrane is performed by hardening the glue at 80° C., a measurement at room temperature (20° C.) already leads to a temperature difference of −60° C. and, thus, to a pump membrane bend downwards by 5 μm. In other words, due to the fact that the temperature expansion coefficient of the silicon pump membrane is smaller than the temperature expansion coefficient of the piezo drive means, the bending of the piezo drive means to the pump membrane at the increased production temperature $T_{production}$ causes a pre-bulging of the pump membrane in a downward direction (negative z-values) when the pump membrane and the piezo drive means are cooled down, for example, to room temperature. This pre-bulging of the pump membrane in downward direction is disadvantageous as it does not allow to use, e.g. planar pump chamber floors, increases the dead volume and/or involves adapting the pump chamber floor to the bend line of the pumping membrane, which is complex and costly as described previously. In addition, a certain pre-bulging in downward direction is almost unavoidable in case of silicon membranes because silicon membranes have a lower temperature expansion coefficient than the piezo drive and glues used for bonding the piezo drive to the pump membrane are typically hardened at temperatures higher than normal ambient or operation temperatures.

As mentioned before, in case the temperature expansion coefficient of the pump membrane is higher than the temperature expansion coefficient of the piezo drive means, the pump membrane is pre-bulged in the opposite direction, i.e. in the upward direction after cooling the pump membrane and the piezo drive means to, for example, room temperature. Thus, positive or upwards pre-bulged pump membranes can easily be produced without requiring additional processing steps, e.g. formation of an additional oxide layer.

The bending shape 714 can be regarded as the bending shape the pump membrane assumes when the drive means is not actuated and no other external pressure or influence is applied to the pump membrane. As can be seen from FIG. 7A, the height z (or H) is about −5.35 μM in the centre of the pump membrane. In case a negative drive voltage of −50 V is applied (see reference sign 712), the pump membrane is deflected in an upward direction, because the piezo drive means expands, and in case a positive voltage of +150 V is applied as a drive voltage, the pump membrane bends further downwards (see reference sign 716) due to the contraction of the piezo drive means.

Applying a voltage, for example, a production voltage $U_{production}$ to the piezo drive means during the bonding of the piezo drive means to the pump membrane, the temperature effect shown in FIG. 7A (the downward bending of the pump membrane) can be counter-acted, partially compensated, fully compensated or even over-compensated depending on the production voltage applied during the bonding. For compensating a temperature difference of 60°, for example, in case the bonding of the piezo drive means to the pump membrane is performed at 80° C. and the micro pump is operated or used later at 20° C., a production voltage of 73.6 V may be used so as to compensate the negative pre-bending caused by the temperature difference of 60° C., i.e. to obtain a planar shape in case the drive means is not actuated. As the bending shapes are identical (i.e. normalized identical), the stroke and the volumes are compensated at the same time and the pump membrane again assumes a plain shape, when no external pressure and no voltage is applied.

FIG. 7B shows a diagram of bending shapes of half of the pump membrane from the centre to the border for a piezo bonding to the pump membrane at 80° C. and a production voltage of 73.6V (in a representation similar to FIG. 7A). Reference sign 722 shows the bending shape of the pump membrane at 20° C. and a drive voltage of −50 V without external pressure P. Reference sign 724 shows the bending shape of the pump membrane at 20° C. and 0 V (no drive voltage) and without external pressure and reference sign 726 shows the bending shape of the pump membrane at 20° C. and a drive voltage of 150 V at one bar external pressure P. As can be seen from FIG. 7B, bonding the piezo drive means at 80° C. and applying, during the bonding, the production voltage of 73.6 V, the negative or downward pre-bending caused by the temperature difference of −60° C. and the positive or upward pre-bending by releasing the production voltage compensate each other so that the pump membrane assumes a plain shape (see reference sign 724) when the piezo drive means is not actuated. As already explained based on FIG. 7A, an application of a negative voltage to the piezo drive means causes the pump membrane to be deflected upwards (see reference sign 722), whereas an application of a positive voltage causes the pump membrane to bulge downwards (see reference sign 726).

FIG. 7C shows a diagram similar to the one of FIG. 7B (for the same pump membrane as in FIG. 7B). The two upper bending shapes are identical. Reference sign 728, however, refers to the bending shape resulting from applying a drive voltage of 150V and an external pressure of 1 bar. As can be seen, applying a drive voltage of 150 V causes the pump membrane to deflect downwards although a counter pressure P of 1 bar is applied to the pump membrane.

In the following, it is exemplarily calculated which voltage is to be applied during the bonding of the piezo drive means to the pump membrane (at 80° C.) such that the pump membrane just touches or abuts at a certain counter-pressure and at a drive voltage of 150 V, on the upper surface of the pump body. The pressure shall be the one that follows from the resulting compression ratio.

FIG. 7D shows a diagram with bending shapes of the pump membrane in a similar representation as in FIGS. 7A to 7C, however, for a pump membrane, wherein the bonding of the piezo drive means has been performed at 80° C. and at a production voltage of 178V. Reference sign 732 refers to the bending shape of the pump membrane from the centre to the border of the pump membrane at 20° C. and −50 V without pressure. Reference sign 734 refers to the bending shape of the pump membrane in a non-actuated state (drive voltage U=0 V) and without external pressure (P=0). Reference sign 736 refers to the same pump membrane (pre-bending by bonding the piezo drive means at 80° C. and 178 V) when a production voltage of 150 V is applied to the piezo drive means and the counter-pressure of one bar is applied to the pump membrane. As can be seen from FIG. 7D, the higher production voltage of 178 V of FIG. 7D compared to the production voltage of 73.6 V of FIGS. 7B and 7C effects a pre-bulging of the thick silicon pump membrane in the upward direction although the temperature expansion coefficient of the silicon pump membrane is smaller than the temperature expansion coefficient of a piezo material of the piezo drive means, i.e. the pre-bulging of the pump membrane downwards due to the different temperature coefficients is overcompensated by the application of the production voltage. With these production parameters, a pre-bulging height of approximately 7.5 μm can be achieved in the centre of the pump membrane. In case a negative drive voltage is applied (see reference sign 732), the pump membrane is deflected upwards, whereas in case a positive drive voltage is applied, the pump membrane is deflected downwards towards the pump body (see reference sign 736).

As can be seen, the pump membrane abuts on the pump chamber floor or the pump body although a counter-pressure of one bar is applied. The counter-pressure P causes a slight deflection of the pump membrane at the border. In case no counter-pressure is applied (P=0 mbar), the pump membrane will completely abut to the pump chamber floor, because the pre-bulging is adapted to the deformation caused by the actuation of the piezo drive means.

The remaining dead volumes below the pump membrane 736 are about 11.5 mL and occur only in case of the aforementioned counter-pressure. However, these dead volumes are small compared to the total stroke volume (the volume between shape 732 and 736 of the pump membrane) of about 163 mL.

Summarizing the aforementioned, embodiments of the method for producing the pre-bulged pump membrane offer a wide variety of combinations of pump membrane materials and drive means, for example, piezo drive means, and allow to flexibly adjust the production parameters, e.g. production signal, production voltage and/or production temperatures to comply with predetermined operation parameters the micro pump has to fulfill, for example, stroke height, stroke volume, compression ratios, counter-pressures.

Embodiments of the method for producing the pre-bulged pump membrane using a production signal to contract the drive means and to bond the drive means in the contracted state to the pump membrane are very flexible as almost any signal value or voltage value can be used as a production value or a production voltage. Thus, almost any pre-bulging height, stroke height and stroke volume can be achieved.

In case glues are used for bonding the drive means to the pump membrane, the glues typically have a glue specific production temperature at which they have to be hardened. These production temperatures are typically higher than the ambient room temperature. Depending on the magnitude of the production temperature and the difference between the production temperature and the operation temperature the micro pump, or in general the bending transducer, is used later during normal operation, pre-stressing and potentially pre-bulging of the pump membrane and the drive means are caused inherently in case the drive means and pump membrane have different temperature expansion coefficients. By selecting the appropriate drive means and pump membrane materials, for example the respective piezo ceramics and steel or synthetic materials for the membrane, the pre-stressing effect caused by the different temperature expansion coefficients can be used to increase the pre-stressing and potentially the pre-bulging of the pump membrane. The same considerations apply to other bonding methods using bonding materials, e.g. soldering.

A consideration of both effects even allows to use pump membrane materials with smaller temperature expansion coefficients than the piezo drive means, e.g. semiconductor pump membranes like silicon pump membranes, although they would normally cause a pre-bulging in the downward direction. However, by additionally applying an appropriate production signal or production value, the pre-bulging in the downward direction can be more than compensated to finally achieve a pre-bulging in the upward direction.

In other words, in certain embodiments a second thermal expansion coefficient (thermal expansion coefficient of the drive means comprising a second material) is higher than a first thermal expansion coefficient (thermal expansion coefficient of the membrane comprising a first material) and the production signal is such that a pre-bulging of the pump membrane in a first direction effected by releasing the production signal more than compensates a pre-bulging of the pump membrane in a second direction opposite to the first direction effected by cooling the bonded drive means and pump membrane.

Further embodiments of a method of producing the pre-bulged pump membrane therefore comprise determining, for example, automatically, based on a predetermined counter-pressure value at which the pump membrane shall assume the second position when the drive means is actuated, the first and second material and/or the production signal value.

Compared to pre-bulging methods using oxide layers on top of the piezo actuators, embodiments of the present invention involve less material (no oxide layer), less production steps (no formation of the oxide layer between the pump membrane and the piezo drive means), are more flexible with regard to the achievable stroke volumes and stroke heights, and provide higher stroke heights and stole volumes.

In certain embodiments the bonding of the drive means to the pump membrane is performed such that the pump chamber has a first volume when the pump membrane is in said first bulged position and a second volume when the pump membrane is in the second less bulged position, wherein the second volume is smaller than the first volume, wherein the pump membrane, the pump body and the passive inlet and outlet check valves are arranged such that a compression ratio is greater than 50 or greater than 100, wherein the compression ratio is defined by the ratio of a stroke volume of the micro pump and the second volume, and wherein the stroke volume is defined by a difference between the first volume and the second volume. The second volume is, for example, essentially defined by a volume of valve wells within the pump body at sections of the passive inlet and/or outlet check valve, and/or recesses in the passive inlet or outlet check valves themselves and/or anti-sticking means adapted to prevent that the pump membrane sticks to the first surface of the pump body when the pump membrane is in the second position.

Alternative embodiments may use laser bonding or other bonding technologies to bond the drive means such to the pump membrane and apply the production signal during the bonding as described above to achieve the pre-stressing of the bending actuator and potentially a pre-bulging.

In further embodiments the drive means can be adapted to drive the pump membrane to a third more bulged position (e.g. by applying a negative voltage to a piezo drive means) before it moves the pump membrane to the second less bulged position.

In the following, embodiments of a micro valve comprising a bending transducer manufactured by an embodiment of the present invention are described.

FIGS. 7E, 7F, 7FF and 7G show schematic cross-sectional views of a normally closed micro valve 700. FIGS. 7E and 7F show the micro valve in a non-actuated self-blocking state: no operation or drive voltage is applied (U=0V) and the valve is closed. FIG. 7E shows a side-view with the inlet ports, whereas FIG. 7F shows the 90 degree turn side-view with the outlet ports. FIGS. 7FF and 7G show the micro valve in an open state. A positive operation voltage or drive voltage is applied (U>0V). FIG. 7FF shows the same side-view as FIG. 7E, i.e. the side-view with the inlet ports (however in an open state) and FIG. 7G shows the same side-view as FIG. 7F, i.e. the side-view with the outlet ports (however, in an open state). The micro valve has a similar design as the micro valves described in US 2004/0036047 A1 and US 2006/0027772 A1. As can be seen from FIGS. 7E-7G the micro valve 700 consists of a first chip or actor chip 740 and a second chip or flap chip 750. The actor chip 740 comprises a recess or dip 742 on a first main side or surface 744 (top surface according to FIGS. 7E-7F) and a recess or dip 743 on an opposing main side 745, and a membrane 110 formed through both recesses or dips 742 and 743. The drive means, for example, a piezo ceramic is arranged on the first surface or side 112 of the membrane 110. A tappet 746 protrudes on a second opposing side 114 of the membrane 110. The first chip 740 further comprises sealing lips 748 protruding, like the tappet 746, from the second surface 114 of the membrane 110. The second chip 750 comprises fluid inlets 752 formed in the second chip (see FIGS. 7E and 7FF) and fluid outlets or valve outlets 754 (see FIGS. 7F and 7G). The second chip 750 further comprises a flexible shutter or closing element 754 that is mechanically connected to the membrane 110 via the tappet 746. As can be seen from FIGS. 7F and 7G the shutter comprises recesses 756 on a surface facing away from the membrane to enable a deflection or movement downwards in case the drive means 210 is actuated. As can be seen from FIG. 7E, the sealing lips 748 fluidly disconnect or seal the valve inlets 752 from the recess 743, also referred to as valve chamber recess 743, in case the drive means is not actuated. In case the drive means 210 is actuated, the bending transducer formed by the drive means 210 and a membrane 110 bends downwards and at the same time bends downwards the shutter 754 and opens the valve by providing a fluid connection between the valve inlet 752 and the valve chamber recess 743 (see FIG. 7FF). As can be seen from FIGS. 7F and 7G, the outlet ports 754 are in fluid connection to the valve chamber recess 740. In other words, by activating the drive means 210, the valve inlets 752 are fluidly connected to the valve outlets 754 via the valve chamber recess 743.

The first chip 740 and the second chip 750 can be made of silicon or any other material. However, in case the first and second chips 740, 750 are silicon or other semiconductor chips, the bonding of the drive means 210 using a glue or adhesive requiring a specific production temperature for hardening may lead to unwanted pre-bulging of the pump membrane 110 in direction to the shutter 754, thus, reducing the sealing reliability of the normally closed valve 700. The same considerations apply to other bonding methods that effect or may utilize heating of the two chips.

Embodiments of the invention allow to compensate or even over-compensate the pre-bulging in direction towards the shutter 754 by applying a production signal, for example, a positive production voltage in case of piezo actuators 210. A pre-stressing of the drive means, for example, the piezo drive means, according to embodiments of the invention have the effect that the micro valve is securely or reliably closed. Already a small pre-stressing of drive means may be sufficient to provide a reliably normally closed valve. In addition, the threshold pressure up to which the valve remains closed in case a backward pressure is applied can be easily adjusted by applying an appropriate production signal.

Figure 7H:
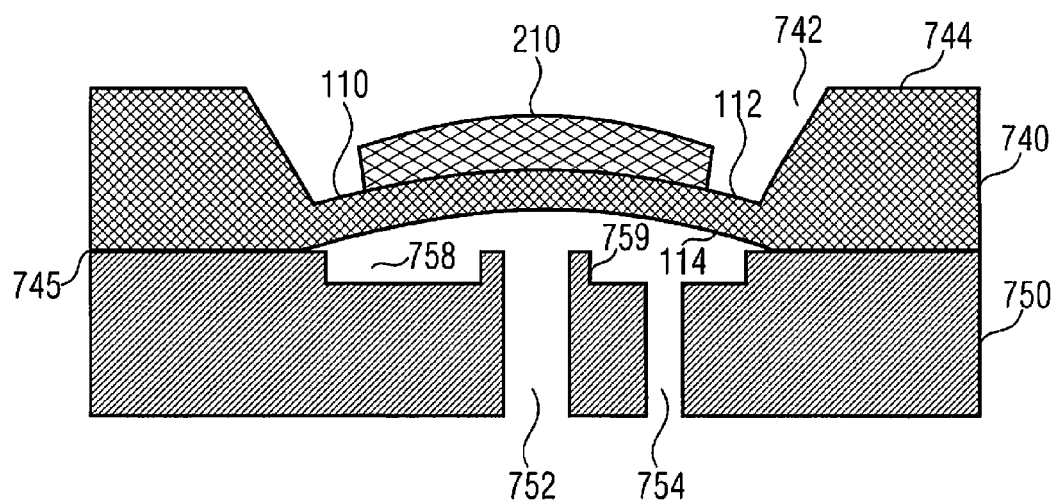

FIG. 7H shows an embodiment of a normally open micro valve consisting of a first chip 740 and a second chip 750. The first chip 740 comprises a recession 742 on a first side 744, so as to form a valve membrane 110. On a first side 112 of the membrane 110 facing away from the second chip 750 the drive means, for example a piezo drive means 210, is bonded to the membrane 110. The drive means 210 and the membrane 110 form a bending transducer. A first chip 740 is connected via a second surface or side 745 opposite to the first surface or side 744 to the second chip 750. A second chip 750 comprises a valve inlet 752 formed by a through-hole extending from a side of the second chip facing towards the first chip to an opposed side of the second chip, and a valve outlet 754 formed similar to the valve inlet 752 by a through-hole extending from the first side of the second chip facing towards the first chip and the opposed second side or surface. On the first side of the second chip 750 a recession 758 is formed to define a valve seat or valve lips 759.

The drive means 210 has been bonded to the membrane 110 according to an embodiment of the invention and is pre-bulged in a direction facing away from the second chip. Thus, in case the drive means 210 is not actuated, the valve inlet 752 and the valve outlet 754 are in fluid connection and the valve is opened. In case the drive means 210 is actuated, the drive means 210 moves the membrane 110 down until it touches the valve lips 759 to seal or close the valve.

Figure 7I:
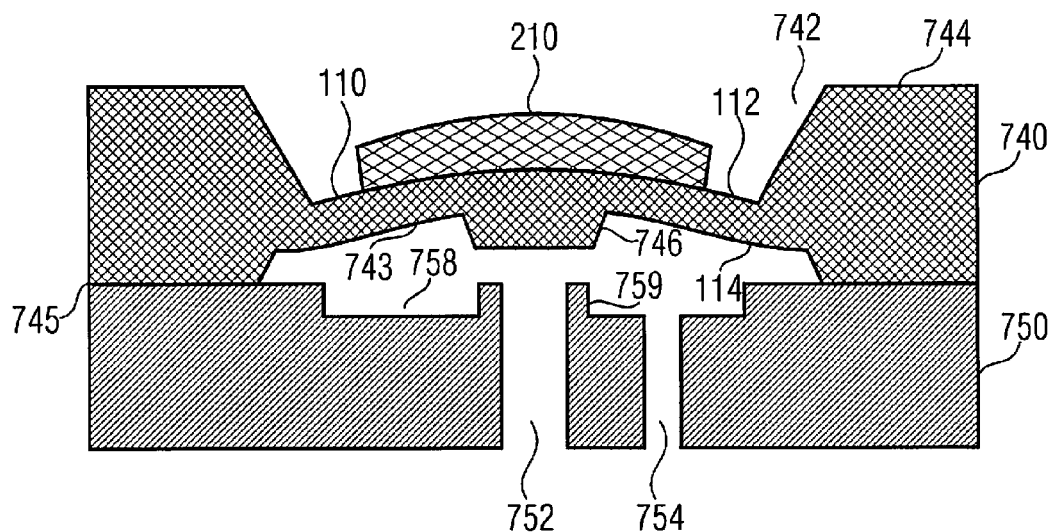
Figure 8:
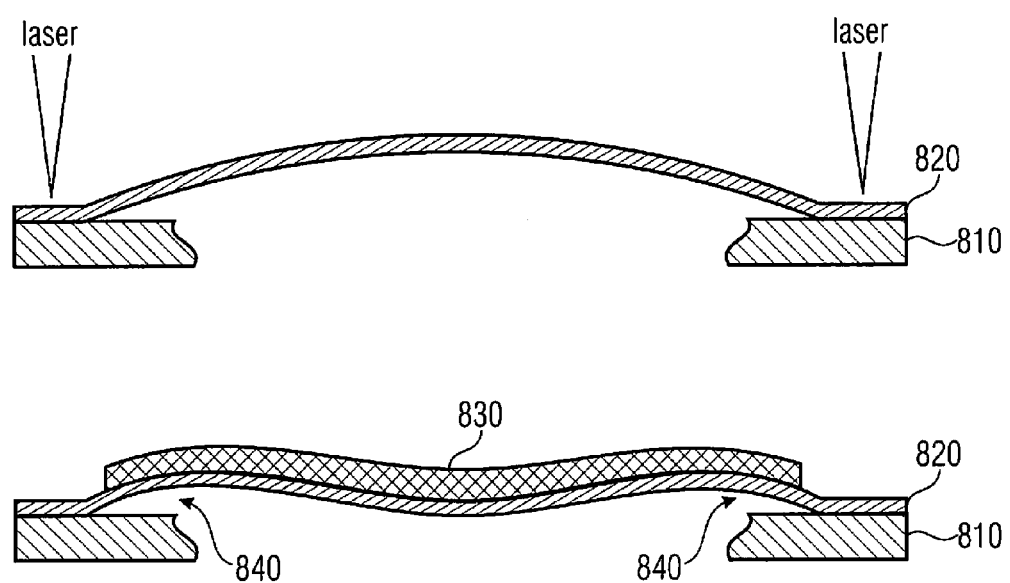
FIG. 8 shows a schematic of a micro pump with a conventional pre-stressed membrane in a non-actuated and an actuated state.

FIG. 7I shows a further embodiment of a normally open valve similar to the normally open micro valve of FIG. 7H. In contrast to the micro valve of FIG. 7H, the micro valve of FIG. 7I comprises an additional recession 743 on a second side 745 of the first chip and a tappet 746 protruding from the second side of the valve membrane 110. The tappet 746 is arranged opposite to the valve inlet 752 and the valve seals 759.

The drive means 210 is bonded to the membrane 110 according to an embodiment of the invention and is pre-bulged. In case the drive means 210 is not actuated, the valve inlet 752 is in fluid connection with the valve outlet 754 due to the pre-bulged shape of the membrane 110. In case the drive means 210 is actuated, the membrane is moved towards the second chip and the tappet 746 abuts on the valve lips 759 and closes the valve.

Embodiments of the micro valves as shown in FIGS. 7H and 7I having a pre-bulged membrane are advantageous with regard to production engineering and also functional advantages. In case the membrane is formed by silicon or other semiconductor materials, no distance element or structure between the valve seat or lips and the closing element (membrane or tappet) has to be foreseen. Thus, one mask, one lithography and one etching step less may be used and, thus, the production cost and complexity is reduced.

In case the normally open valve is closed, the membrane or the tappet is in a plain condition. In particular, in case of non-circular valve seats or lips or even at meander shape valve seats (used to increase the flow-through) remaining gaps can be avoided which would be present in case the membrane would be deflected to close the valve. Thus, embodiments of the invention provide micro valves with improved sealing characteristics that are easy to design and manufacture.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for manufacturing a micro pump, the micro pump comprising a bending transducer with a membrane and a drive element, wherein the membrane forms a pump membrane and is adapted to be moved between a first bulged position and a second less bulged position by the drive element; and a pump body connected to the pump membrane so as to define the pump chamber between the pump body and the pump membrane; the method comprising:
   manufacturing the bending transducer by a method comprising:
      providing the membrane and the drive element; and applying a production signal to the drive element during the bonding of the drive element to the membrane such that the drive element is pre-stressed after the bonding, wherein the production signal is of a same kind as an operation signal to operate the bending transducer, such that the pump membrane assumes a pre-bulged shape in the first bulged position when the drive element is not actuated, wherein the membrane comprises a semiconductor material.

2. The method according to claim 1, wherein the production signal is only released after the bonding has been terminated.

3. The method according to claim 1, wherein the bonding is performed by means of a bonding material arranged between the drive element and the membrane, and wherein the production signal is only released after the bonding material is hardened.

4. The method according to claim 2, wherein the bonding material is a glue or a soldering material.

5. The method according to claim 2, comprising:
pressing the drive element to the membrane during the bonding of the drive element to the membrane, wherein the pressing is only terminated after the bonding material is hardened.

6. The method according to claim 1, wherein the production signal is such that the drive element is in a contracted state during the bonding.

7. The method according to claim 1, wherein the production signal is such that after the bonding the bending transducer assumes a pre-bulged shape with a pre-bulging in direction of the drive element relative to a bonding surface between the drive element and the membrane.

8. The method according to claim 1, wherein the drive element is a piezo drive element and the production signal is a production voltage.

9. The method of claim 1, wherein a temperature coefficient of the membrane is greater than a temperature coefficient of the drive element, wherein the bonding of the drive element to the membrane is performed at a production temperature that is higher than an operation temperature the drive element is later operated and the production signal is such that the drive element is in a contracted state during the bonding.

10. The method according to claim 9, wherein the drive element is a piezo drive element and the production signal is a positive production voltage, and wherein the membrane comprises a metal or a synthetic material.

11. The method of claim 1, wherein a temperature coefficient of the membrane is smaller than a temperature coefficient of the drive element, wherein the bonding of the drive element to the membrane is performed at a production temperature that is higher than an operation temperature the drive element is later operated and the production signal is such that said pre-stressing effected by applying the production signal more than compensates an inverse pre-stressing effected by the different temperature coefficients.

12. The method according to claim 11, wherein the drive element is a piezo drive element and the production signal is a positive production voltage.

13. The method according to claim 1, wherein the micro pump comprises an inlet check valve and an outlet check valve both in fluid connection to the pump chamber and arranged in the pump body opposite to the pump membrane, wherein the pump body comprises a first surface arranged opposite to the pump membrane that is essentially planar, and wherein the pump membrane comprises an essentially planar shape in the second position, such that a dead volume of the pump chamber is essentially defined by the volumes of valve wells of the inlet check valve and the outlet check valve such that a compression ratio of the micro pump is greater than 50, wherein the compression ratio is defined as the ratio between the stroke volume of the pump membrane and the dead volume of the micro pump.

* * * * *